United States Patent [19]
Kajihara et al.

[11] Patent Number: 5,623,306
[45] Date of Patent: Apr. 22, 1997

[54] DARK CURRENT SUPPRESSION FOR SOLID STATE IMAGE SENSING DEVICE

[75] Inventors: Nobuyuki Kajihara; Gen Sudo; Kenji Arinaga; Koji Fujiwara; Hiroko Nakamura, all of Kawasaki, Japan

[73] Assignee: Fujitsu Limited, Kawasaki, Japan

[21] Appl. No.: 494,758

[22] Filed: Jun. 26, 1995

Related U.S. Application Data

[63] Continuation of Ser. No. 235,717, Apr. 29, 1994, abandoned.

[30]    Foreign Application Priority Data

May 21, 1993  [JP]  Japan ................................. 5-120191

[51] Int. Cl.$^6$ ........................................................ H04N 9/64
[52] U.S. Cl. ............................ 348/243; 348/241; 348/314; 257/315
[58] Field of Search ............................ 348/302, 303, 348/308, 243, 311, 314, 241; 257/315, 316; H04N 9/64

[56]                References Cited

U.S. PATENT DOCUMENTS

| | | | |
|---|---|---|---|
| 4,496,982 | 1/1985 | Levine | 358/221 |
| 4,685,117 | 8/1987 | Arques | 164/479 |
| 4,959,701 | 9/1990 | Colquitt, Jr. et al. | 357/23.5 |
| 4,995,061 | 2/1991 | Hynecek | 358/213.26 |
| 5,111,430 | 5/1992 | Morie | 357/23.5 |
| 5,262,871 | 11/1993 | Wilder et al. | 358/213.11 |
| 5,270,559 | 12/1993 | Yariv et al. | 257/315 |

FOREIGN PATENT DOCUMENTS

| | | |
|---|---|---|
| 57-50177 | 3/1982 | Japan. |
| 2-194667 | 8/1990 | Japan. |

OTHER PUBLICATIONS

A Multiple-Gate CCD-Photodiode Sensor Element For Imaging Arrays, IEEE Transactions Electronic Devices vol. ED-25, No. 2 Feb. '78, pp. 125–131.

*Primary Examiner*—Michael Horabik
*Assistant Examiner*—Michael Day
*Attorney, Agent, or Firm*—Armstrong, Westerman, Hattori, McLeland & Naughton

[57]                ABSTRACT

A solid-state image sensing device having a plurality of pixels each of which outputs to a transmission portion (12) a signal charge corresponding to an amount of light projected thereon. The signal charge transmitted by the transmission portion (12) is outputted as an image signal for each pixel from the solid state image sensing device. Each pixel includes a photo-diode (32), a storage portion (41) for storing charge corresponding to a current output from the photo-diode (32) onto which light is projected, a transfer portion (42) for transferring the charge stored by the storage portion to the transmission portion, and a control portion (39) for controlling an amount of charge to be received by the transmission portion based on a dark current characteristic of a corresponding photo-diode (32).

18 Claims, 27 Drawing Sheets

DARK CURRENT SUPPRESSION FOR SOLID STATE IMAGE SENSING DEVICE

This application is a continuation application of Ser. No. 08/235,717 filed Apr. 29, 1994, now abandoned.

BACKGROUND OF THE INVENTION (1) Field of the Invention

The present invention generally relates to a solid state image sensing device, and more particularly to a solid state image sensing device in which photo-electric charge generated in photo-diodes is stored therein and information corresponding to the photo-electric charge is read out therefrom by electronic scanning.

In recent years, to increase the number of pixels in a solid state image sensing device and to arrange the pixels with a high density, it is required that all the pixels have uniform characteristics. Thus, improvements in the production process of the image sensing device have been attempted. On the other hand, it is difficult to obtain uniform characteristics of photo-diodes which are made, for example, of compound semiconductor. In this case, output signals from the solid state image sensing device are corrected by complex processing in an external circuit.

In the solid state image sensing device field, it is desired that variation of output signals depending on dispersion of characteristics of the photo-diodes is reduced without complex processing in an external circuit.

(2) Description of the Related Art

In a conventional solid state image sensing device having photo-diodes, a single bias voltage is supplied to the respective photo-diodes and electric charge corresponding to the quantity of light to each photo-diode and affected by the dark current of each photo-diode is stored therein and read out therefrom. Thus, in an external circuit coupled to the solid state image sensing device, dark current characteristics of the respective photo-diodes have been previously stored in a semiconductor memory, and the output signal from each pixel is corrected based on a dark current characteristic stored in the semiconductor memory for a corresponding photo-diode.

As has been described above, when the conventional solid state image sensing device is used, the dispersion of the dark currents of the respective photo-diodes must be compensated for by the external circuit. Thus, the external circuit coupled to the solid state image sensing device is complex and a long processing time is needed in the external circuit.

In addition, if the bias voltage is set to a value suitable for a photo-diode having a small dark current, the storage capacity of electric charge in a photo-diode having a large dark current is insufficient so that an output signal from a corresponding pixel is saturated. In this case, this pixel is a defective pixel. On the other hand, if the bias voltage to be supplied to the photo-diodes is set to a low value to prevent pixels corresponding to photo-diodes having a large dark current from being defective, the sensitivity of the solid state image sensing device deteriorates.

SUMMARY OF THE INVENTION

Accordingly, a general object of the present invention is to provide a novel and useful solid state image sensing device in which the disadvantages of the aforementioned prior art are eliminated.

A more specific object of the present invention is to provide a solid state image sensing device in which the dispersion of image signals caused by the dispersion of the characteristics, such as the dark currents, of photo-diodes can be reduced without processing in an external circuit.

The above objects of the present invention are achieved by a solid state image sensing device having a plurality of pixels each of which outputs to a transmission portion signal electric charge corresponding to an amount of light projected thereon, the signal electric charge transmitted by said transmission portion being output as an image signal for each pixel from said solid state image sensing device, each pixel comprising: a photo-diode; storage means for storing electric charge corresponding to a current output from said photo-diode onto which a light is projected; transfer means for transferring the electric charge stored by said storage means to said transmission portion; and control means for controlling, in accordance with a characteristic of said photo-diode, an amount of signal electric charge to be received by said transmission portion.

According to the present invention, since the amount of signal electric charge supplied from each pixel to the transmission portion is controlled in accordance with a characteristic of the photo-diode (e.g. the characteristic regarding the dark current or the sensitivity), a solid state image sensing device in which the dispersion of image signals caused by the dispersion of photo-diode characteristics, such as the dark currents, can be reduced without processing in an external circuit can be obtained.

Additional objects, features and advantages will become apparent from the following detailed description when read in conjunction with the accompanying drawings.

DESCRIPTION OF THE PREFERRED EMBODIMENTS

A description will now be given of embodiments of the present invention.

Figure 1:
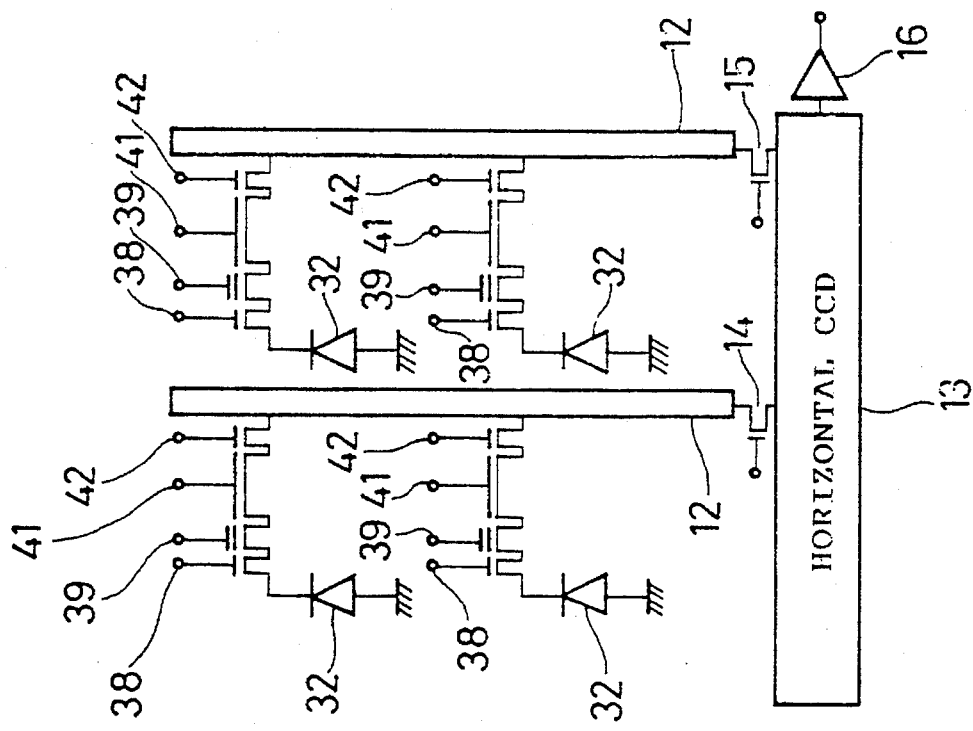
FIG. 1 is a diagram illustrating an example of a two-dimensional structure of a solid state image sensing device according to the present invention.

FIG. 1 shows a CCD (Charge Coupled Device) type solid state image sensing device having pixels arranged in a 2×2 matrix. In FIG. 1, a photo-diode 32 and an input circuit having input gate electrodes 38 and 39, a storage electrode 41 and a transfer gate electrode 42 are provided for each pixel. The input circuit is formed on an insulating layer on a substrate. In this input circuit, the dark current of the photo-diode 32 corresponding to each pixel is controlled as will be described later.

The electric charge generated by the photo-diode 32 on which light is incident is stored in the substrate under the storage electrode 41, and the electric charge for each pixel is transmitted (shifted) by a vertical CCD 12. When transistors 14 and 15 are turned on, the electric charge for pixels aligned in a row is transferred as pixel signals from the vertical CCDs 12 to a horizontal CCD 13. The horizontal CCD 13 transmits (shifts out) the pixel signals, and the pixel signals supplied from the horizontal CCD 13 to an amplifier 16 are output therefrom.

Figure 2:
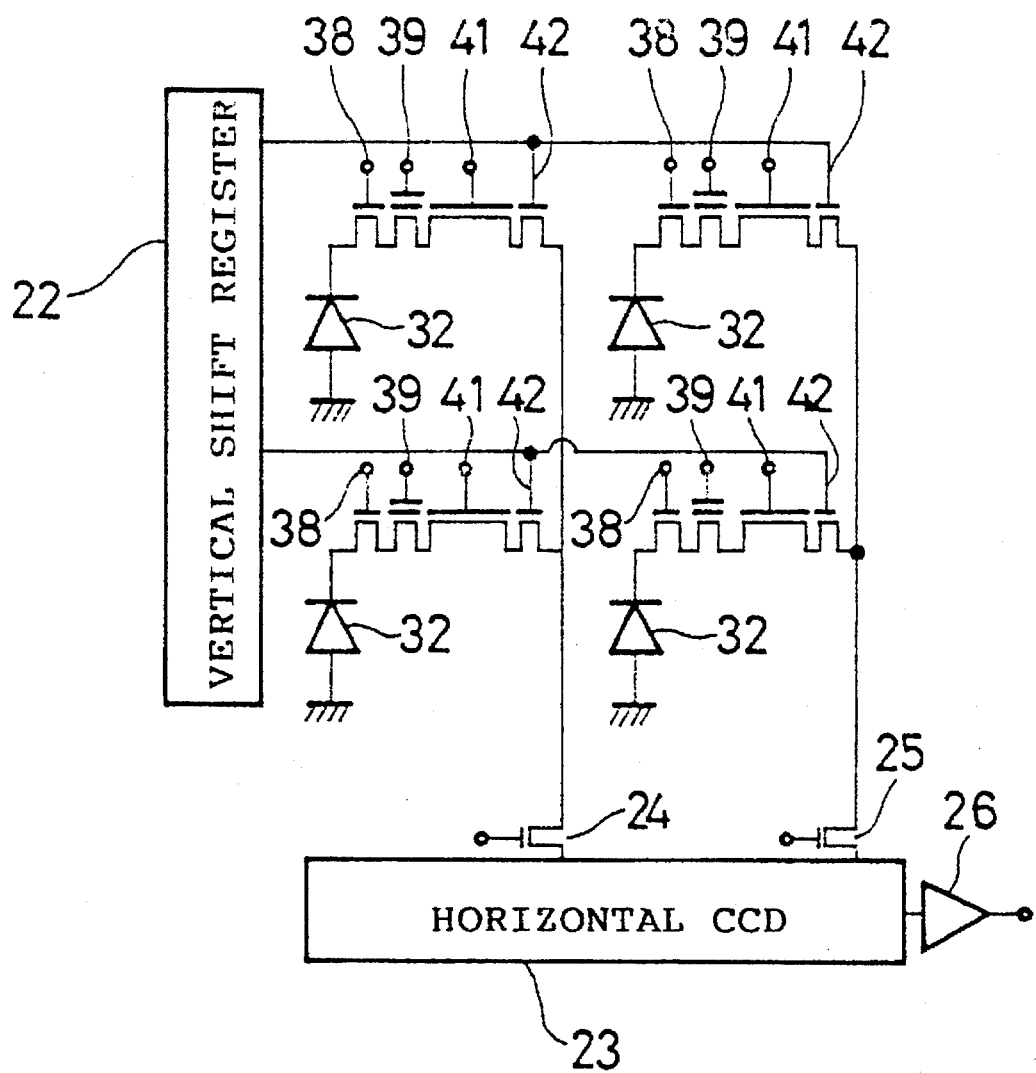
FIG. 2 is a diagram illustrating another example of a two-dimensional structure of a solid state image sensing device according to the present invention.

FIG. 2 shows a MOS type solid state image sensing device having pixels arranged in a 2×2 matrix. In FIG. 2, the photo-diode 32 and the input circuit having the input gate electrodes 38 and 39, the storage electrode 41 and the transfer gate electrode 42 are provided for each pixel in the same manner as the case shown in FIG. 1. The transfer gate electrode 42 for each of pixels aligned in a row is selected and turned on by a vertical shift register 22. When transistors 24 and 25 are turned on, signals for the pixels aligned in the row are transferred to a horizontal CCD 23 via transfer gate electrodes 42. The horizontal CCD 23 transmits the signals for pixels aligned in each row, and the signals supplied from the horizontal CCD 13 to an amplifier 26 are output therefrom.

Figure 3:
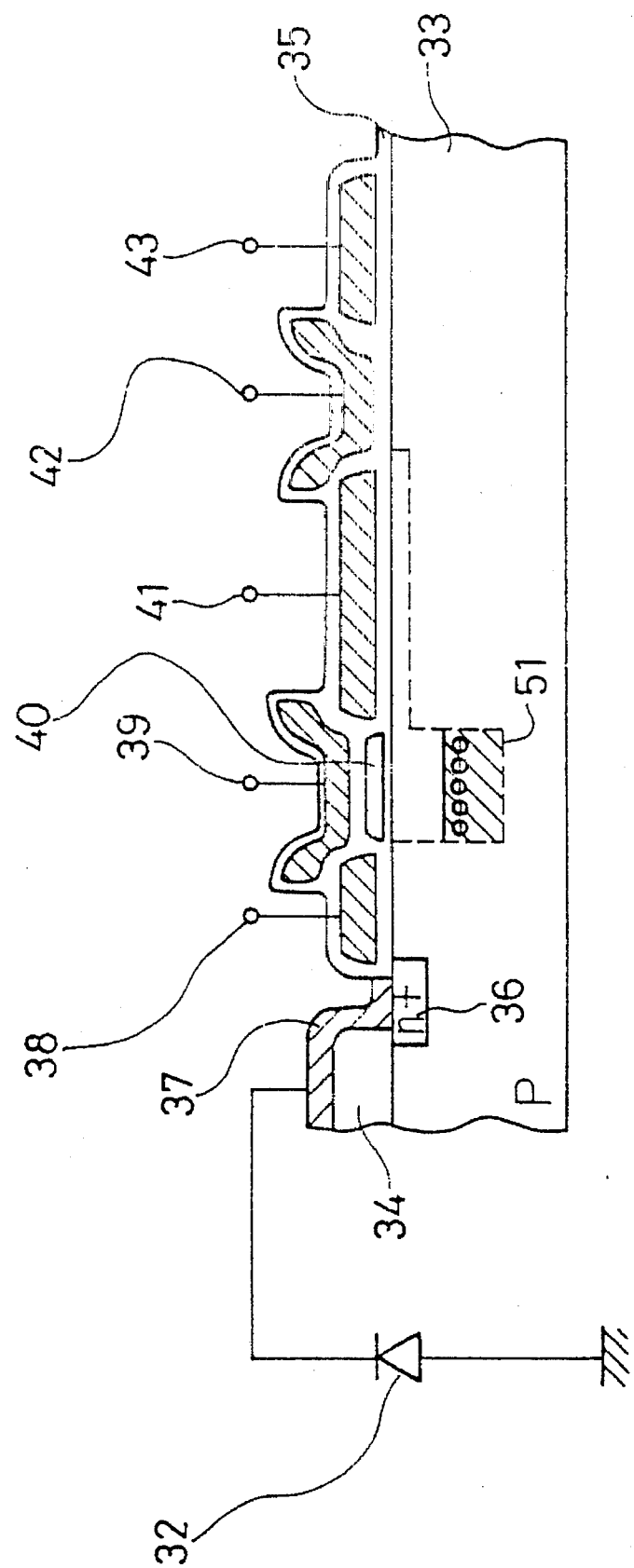
FIGS. 3, 4 and 5 are cross sectional views illustrating a solid state image sensing device according to a first embodiment of the present invention.
Figure 4:
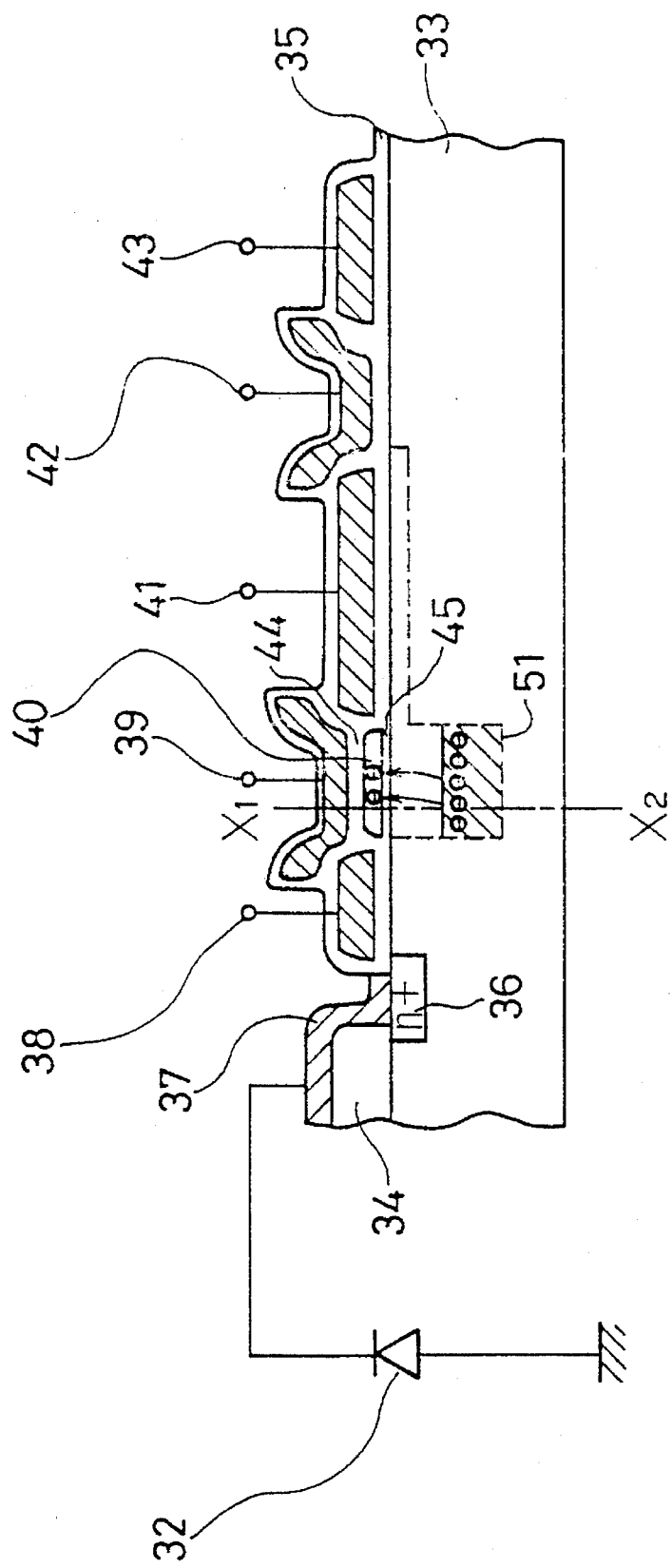
Figure 5:
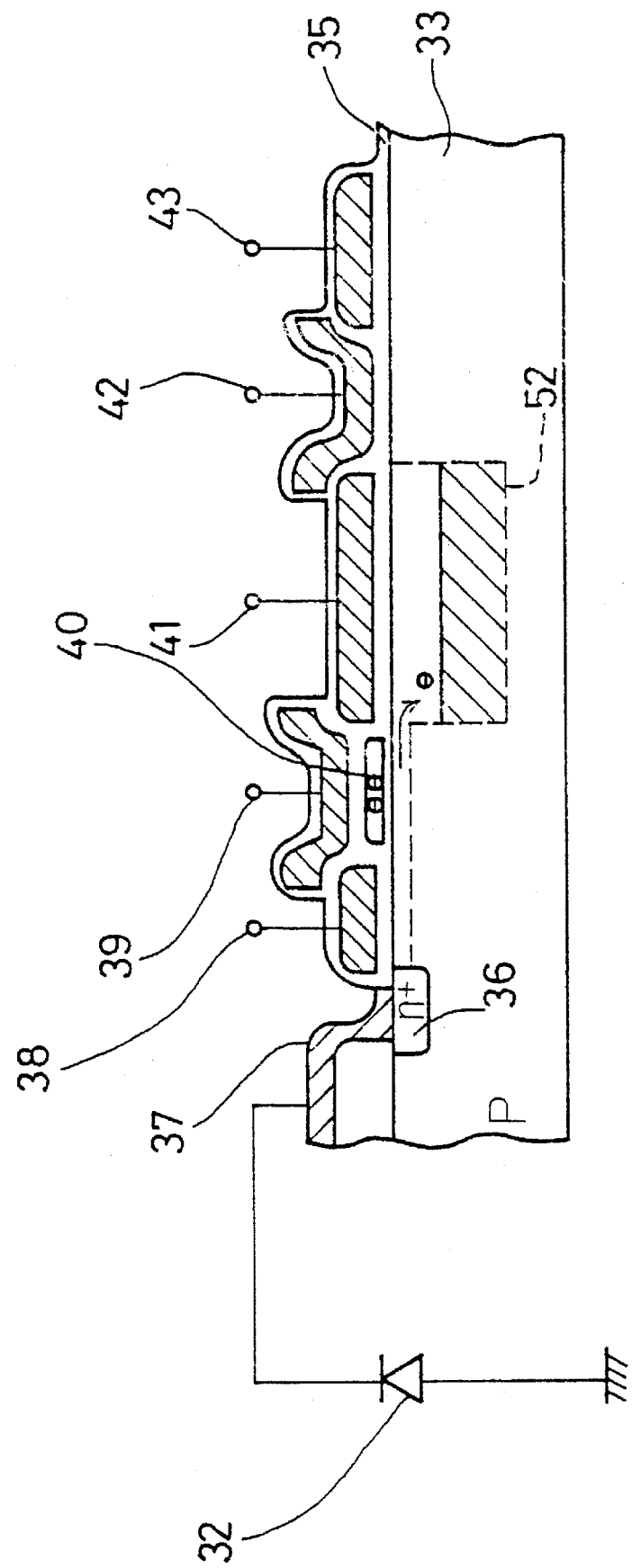

In a first embodiment, the input circuit and the photo-diode 32 provided for each pixel are formed as shown in FIGS. 3, 4 and 5.

Referring to FIG. 3, an n-type region 36 is formed near the surface of the p-type substrate 33 therein, and an insulating film 34 is formed on the surface of the p-type substrate 33 so as to overlap with the n-type region 36. The n-type region 36, the p-type substrate 33, the insulating film 34 and the electrode 37 form an input diode. The n-type region 36 is connected to the cathode of the photo-diode 32 corresponding to a pixel via an electrode 37. The anode of the photo-diode 32 is grounded. The photo-diode 32 is sensitive, for example, to infrared rays.

The substrate 33 is covered by an insulating film 35 made of $SiO_2$. The input gate electrode 38, the storage electrode 41, the transfer gate electrode 42 and a transmission portion electrode 43 of the vertical CCD 12 are formed on the insulating film 35. The input gate electrode 39 which is used to control a bias voltage of the photo-diode 32 is also formed on the insulating film 35. A floating electrode 40 is formed in the insulating film 35 under the input gate electrode 39. The floating electrode 40 functions to control the bias voltage to be supplied to the photo-diode 32. The substrate 33 is grounded.

In the first embodiment, electrons are injected into the floating electrode 40 in accordance with the size of the dark current of the photo-diode 32, and the electrons are maintained in the floating electrode 40. The bias voltage supplied to the photo-diode 32 is controlled by the electrons maintained in the floating electrode 40, so that the dark current of the photo-diode 32 is corrected.

The details are as follows.

First, under a condition in which no light is incident on the photo-diode 32, electrons corresponding to the dark current of the photo-diode 32 is stored in a potential well 51 formed in the substrate 33 under the input gate electrode 39. The potential well 51 is formed as follows. The input gate electrode 38 is controlled so as to be maintained, for example, at about 1 volt which corresponds to the bias voltage of the photo-diode 32, so that an input gate is opened. Further, the input gate electrode 39 is maintained at a predetermined voltage which is about 10 volts, so that the potential well 51 is formed under the input gate electrode 38.

In order to prevent the leakage of electrons stored in the potential well 51, a low voltage is supplied to the storage electrode 41, and the transfer gate electrode 42 is maintained at 0 volt so that the transfer gate is shut down.

In the above state, electrons are injected into the potential well 51 by the dark current of the photo-diode 32 for a predetermined time.

After this, as shown in FIG. 4, the input gate electrode 38 is controlled so as to be maintained at 0 volt so that the input gate is shut down, and the input gate electrode 39 is maintained at a voltage which is about 50 volts higher than the previous voltage. As a result, the electrons stored in the potential well 51 are injected into the floating electrode 40.

Figure 6:
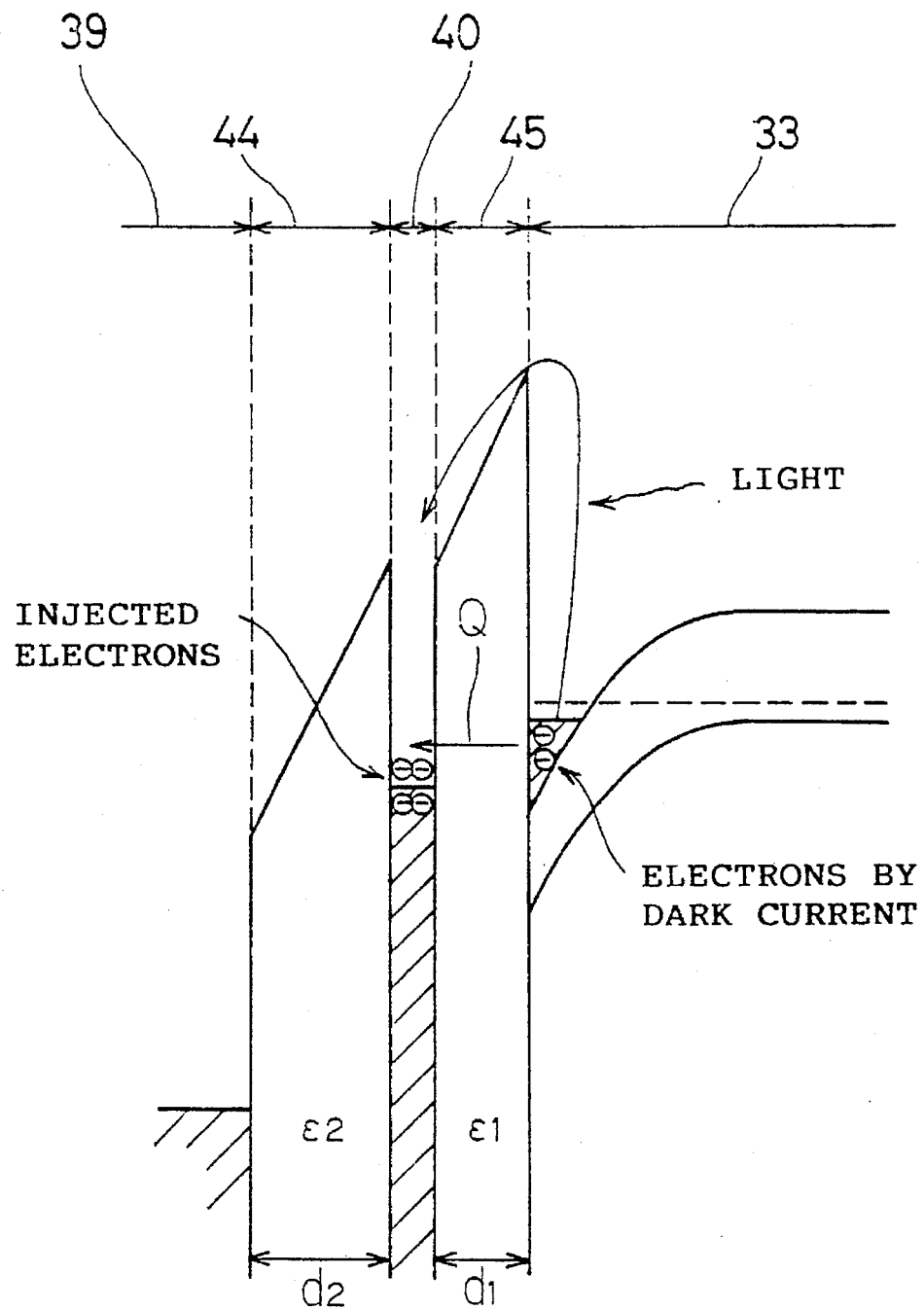
FIG. 6 is a potential diagram illustrating the potential in a section taken along a line X1–X2 shown in FIG. 4.

FIG. 6 is a potential diagram indicating the potential in a section taken along a line X1–X2 shown in FIG. 4. In FIG. 6, the electrons stored in the potential well 51 formed in the substrate 33 tunnel through an insulating portion 45 under the floating electrode 40 and are injected into the floating electrode 40. The electrons are then stored in the floating electrode 40. In this case, the electric charge of the electrons injected into the floating electrode 40 is in proportion to the number of electrons stored in the potential well 51 by the dark current of the photo-diode 32.

To inject the electrons into the floating electrode 40, light having energy exceeding the energy barrier of the insulating portion 45 may also be projected onto the surface of the input circuit under a condition in which the electric charge corresponding to the dark current of the photo-diode 32 is stored in the potential well 51.

After the electric charge corresponding to the dark current of the photo-diode 32 is injected into the floating electrode 40 as described above, light is incident on the photo-diode 32 in an imaging operation. FIG. 5 shows a state where signal electric charge is stored in a potential well 52 formed in the substrate 33 under the storage electrode 41 in the imaging operation. The storage electrode 41 is maintained at a voltage of about 10 volts, so that the potential well 52 is formed.

In the imaging operation, the bias voltage supplied to the photo-diode 32 is controlled by the input gate electrode 39. A predetermined voltage is supplied to the input gate electrode 39 and a voltage slightly higher than the predetermined voltage supplied to the input gate electrode 39 is supplied to the input gate electrode 38. In the imaging operation, the operating point of the photo-diode 32 is moved in accordance with the amount of electric charge maintained in the floating electrode 40, so that the signal electric charge obtained based on the correction of the dispersion of the dark currents of the photo-diodes in the solid state image sensing device is stored in the potential well 52.

The dispersion of the dark currents of the photo-diodes in the solid state image sensing device is reduced in the imaging operation as follows.

Figure 7A:
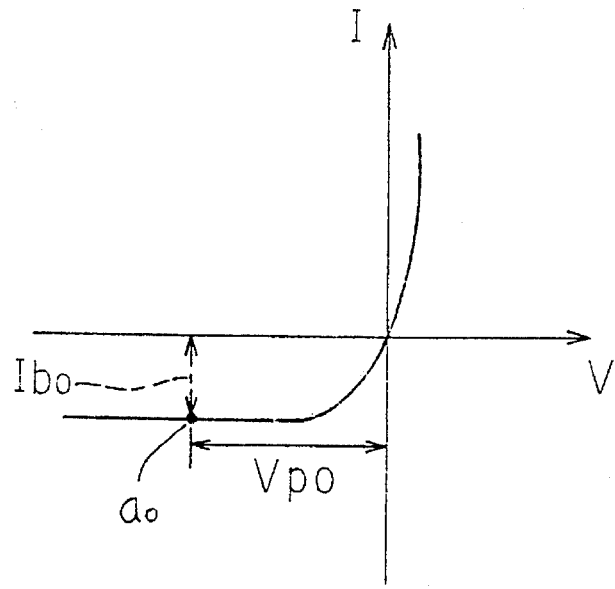
FIG. 7A is a graph illustrating a current-voltage characteristic of a photo-diode.

FIG. 7A shows a current-voltage characteristic of the photo-diode 32. The photo-diode 32 operates under a condition in which a bias voltage is supplied as a reverse bias thereto. A current $Ib_0$ at the operating point $a_0$ at which a predetermined bias voltage $V_{po}$ is supplied to the photo-diode 32 without light incident on the photo-diode 32 is the dark current.

Figure 7B:
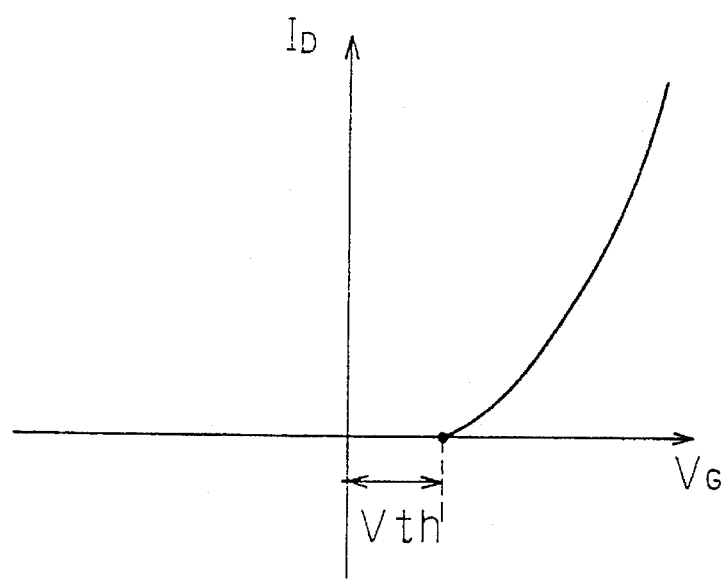
FIG. 7B is a graph illustrating a characteristic of a virtual transistor.

FIG. 7B shows a drain current-gate voltage ($I_D$-$V_G$ characteristic of a virtual transistor having as virtual source the n-type region 36, as virtual drain of the storage electrode 41 and as virtual gate the input gate electrode 39. The virtual transistor has a threshold voltage $V_{th}$.

In the input circuit, the photo-diode 32 and the virtual transistor are serially connected to each other, and the operating point of the photo-diode 32 depends on the current-voltage characteristic of the photo-diode 32 and the $I_D$-$V_G$ characteristic of the virtual transistor.

Figure 8:
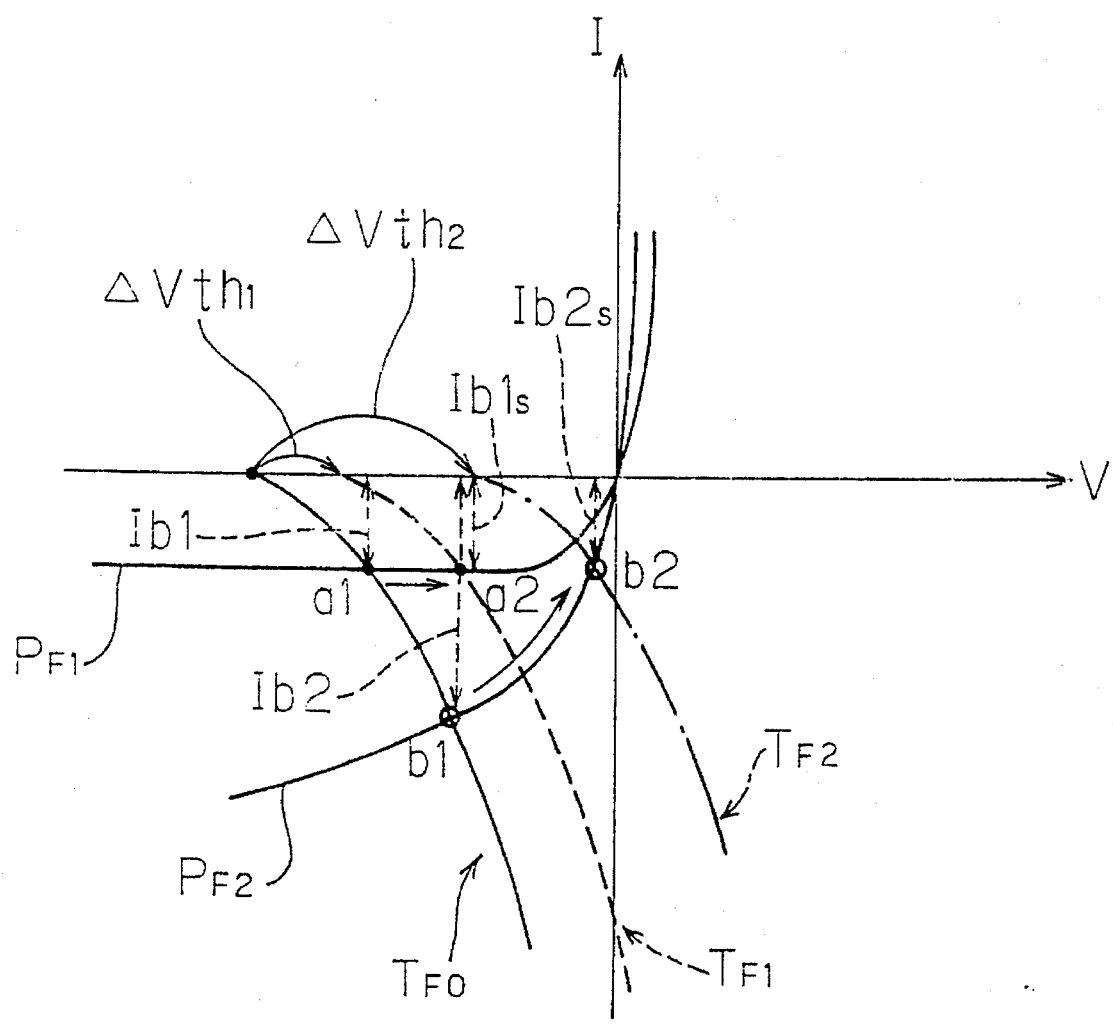
FIG. 8 is a diagram illustrating movement of an operating point caused by a shift of $V_{th}$

The operating point of the photo-diode 32 is moved by shifting the threshold voltage $V_{th}$ of the virtual transistor as shown in FIG. 8. In FIG. 8, $P_{F1}$ represents a characteristic of a photo-diode PV1 having a small dark current, and $P_{F2}$ represents a characteristic of a photo-diode PV2 having a large dark current. A continuous line $T_{FO}$ represents an initial drain current-gate voltage characteristic of the virtual transistor. The dark current of the photo-diode PV1 is Ib1 at an operating point a1. The dark current of the photo-diode PV2 is Ib2 at an operating point a2. The dark current Ib2 of the photo-diode PV2 is about two and a half times as large as the dark current Ib1 of the photo-diode PV1.

When the electric charge Q corresponding to the dark current is injected into the floating electrode 40, the threshold voltage $V_{th}$ is shifted. The shifting quantity $\Delta V_{th}$ of the threshold voltage $V_{th}$ is represented by $$\Delta V_{th} = -Q/(\epsilon_2/d_2)$$

where $d_2$ is the thickness of an insulating portion 44 as shown in FIG. 6, the insulating portion 44 lying between the input gate electrode 39 and the floating electrode 40 as shown in FIG. 4, $\epsilon_2$ is the dielectric constant of the insulating portion 44.

Thus, in the input circuit connected to the photo-diode having a large dark current, the threshold voltage $V_{th}$ of the virtual transistor is greatly shifted. In FIG. 8, in the input circuit connected to the photo-diode PV1, the threshold voltage $V_{th}$ of the virtual transistor is shifted by $\Delta V_{th1}$, and in the input circuit connected to the photo-diode PV1, the threshold voltage $V_{th}$ is shifted by $\Delta V_{th2}$. The shifting quantity $\Delta V_{th2}$ of the photo-diode PV2 is about two and a half times as large as the shifting quantity $\Delta V_{th1}$ of the photo-diode PV1.

Due to the shifting of the threshold voltage $V_{th}$ of the virtual transistor, the operating point of the photo-diode PV1 is moved from a1 to a2, and the operating point of the photo-diode PV2 is moved from b1 to b2. Due to moving of the operating point, the dark current of the photo-diode PV1 is changed from Ib1 to $Ib1_s$, which is approximately equal to Ib1. That is, the dark current of the photo-diode PV1 is almost unchanged. On the other hand, the dark current of the photo-diode PV2 is greatly decreased from Ib2 to $Ib2_s$.

As has been described above, the larger the dark current of the photo-diode, the further the operating point of the photo-diode is moved towards the lower voltage of the reverse bias of the photo-diode. As a result, a larger the dark current of the photo-diode, the larger the quantity by which the dark current is decreased by the electric charge injected into the floating electrode 40. Thus, the dispersion of dark currents of photo-diodes in the solid state image sensing device can be reduced. In addition, since the dark current of the photo-diode is controlled by controlling the bias voltage thereof, the defective pixels and deterioration of sensitivity, which are caused by the lack of the storage capacity of electric charge in a portion under the storage electrode 41 do not occur.

The dispersion of the dark currents of the photo-diodes is reduced as has been described above, and signal electric charge corresponding to each of the dark currents whose dispersion is reduced is stored in the potential well 52 located under storage electrode 41 provided for each pixel, in the imaging operation shown in FIG. 5.

After the signal electric charge is completely stored in the potential well 52, voltages which are higher than the voltage supplied to the storage electrode 41 are supplied to the transfer gate electrode 42 and the transmission portion electrode 43. As a result, the signal electric charge is transferred from the potential well 52 to a transmission portion in the substrate under the transmission portion electrode 43. After this, the transfer gate electrode 42 is set to 0 volt so that the transfer gate is shut down, and the electric charge in the transmission portion is transmitted (shifted) in a direction perpendicular to the plane of the drawing of FIG. 5. Due to the transmission of the signal electric charge, the solid state image sensing device outputs signals.

Figure 9B:
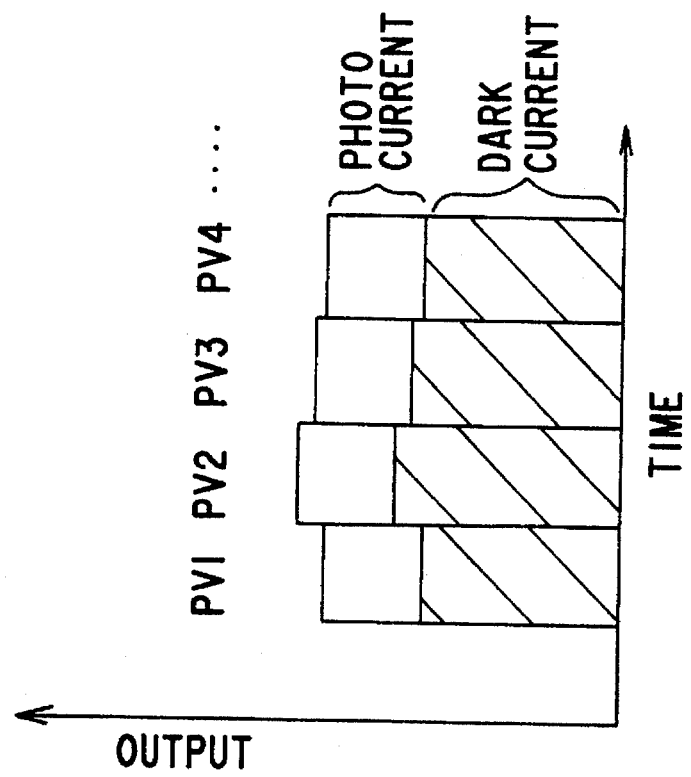
FIG. 9B is a diagram illustrating flattened outputs of the solid state image sensing device.
Figure 9A:
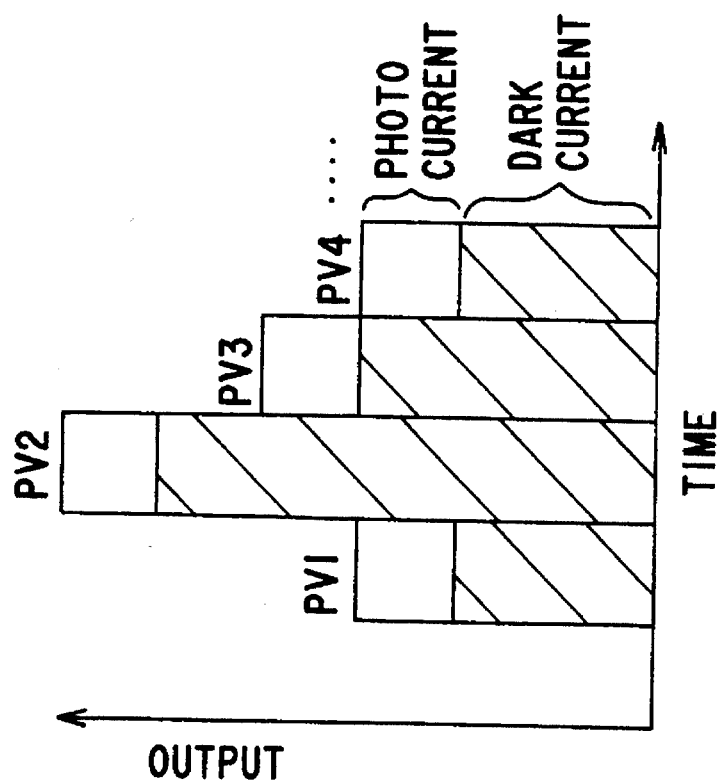
FIG. 9A is a diagram illustrating outputs of the solid state image sensing device.

FIG. 9A shows output signals of the solid state image sensing device in a case where no electric charge corresponding to the dark current is stored in the floating electrode 40. The output signals include the dispersion of the dark currents of the respective photo-diodes PV1, PV2, PV3, PV4, .... On the other hand, FIG. 9B shows output signals of the solid state image sensing device in a case where electric charge corresponding to the dark current is stored in the floating electrode 40. In this case, the dispersion of the dark currents of the photo-diodes PV1, PV2, PV3, PV4, ... is reduced. Thus, it is not necessary for the external circuit to correct the dispersion of the output signals. As a result, the external circuit can be simplified in comparison with an external circuit coupled to the conventional solid state image sensing device.

Since the floating electrode 40 is insulated from other electrodes, the electric charge injected into the floating electrode 40 is maintained therein even if the power supply to the solid state image sensing device is turned off. Thus, the function in which the dispersion of the dark currents of the photo-diodes is reduced, once performed, can remain in effect in the solid state image sensing device for a long time.

The injection of the electric charge into the floating electrode 40 can be repeated. In this case, under a condition in which a negative voltage is supplied as the reverse bias to the input gate electrode 39, a negative voltage whose absolute value is greater than that of the above negative voltage is supplied to the input gate electrode 39, or under a reverse biasing condition, ultraviolet rays are projected onto the device. In this way, the electric charge stored in the floating electrode 40 is set free and dispersed in the substrate 33. After this, new electric charge is injected into the floating electrode 40.

In the above embodiment, under a condition in which no light is incident on the photo-diode 32, the electric charge corresponding to the dark current is stored in the potential well 51 located under the input gate electrode 39, and an amount of electric charge corresponding to the amount of electric charge stored in the potential well 51 is injected into the floating electrode 40. However, the electric charge can be also injected into the floating electrode 40 as follows.

Under a condition in which light is uniformly projected onto the photo-diode 32 so that a current slightly greater than the dark current is generated by the photo-diode 32, the electric charge is stored in the potential well 51, and the amount of electric charge corresponding to the amount of electric charge stored in the potential well 51 is injected into the floating electrode 40. In this case, the amount of electric charge injected into the floating electrode 40 is increased by the projection of the light onto the photo-diode 32. Thus, in the imaging operation, a voltage supplied to the input gate electrode 39 is controlled so as to be increased by the amount corresponding to the increasing of the electric charge injected in the floating electrode 40. As a result, the dispersion of the dark currents of the photo-diodes can be reduced in the same manner as in a case where electric charge is stored in the potential well 51 under a condition in which no light is incident on the photo-diodes.

In this solid state image sensing device, the dispersion of levels of the output signals caused by the dispersion of sensitivities of the photo-diodes can be reduced in the same manner as for the dispersion of the dark currents described above. First, an amount of electric charge corresponding to the sensitivity of each photo-diode 32 is stored in the potential well 51 under a condition in which a weak light is projected onto each of the photo-diodes 32. Next, an amount of electric charge corresponding to the amount of electric charge stored in the potential well 51 is injected into the floating electrode 40. In this case, the higher the sensitivity of the photo-diode, the larger the amount of electric charge injected into the floating electrode. In the imaging operation, the bias voltage across each photo-diode is corrected in accordance with the amount of electric charge injected into the floating electrode 40 so that the dispersion of the levels of the output signals caused by the dispersion of the sensitivities of the respective photo-diodes is reduced.

After the electric charge corresponding to the dark current is stored in the potential well 52 located under the storage electrode 41, the electric charge may be injected into the floating electrode 40.

Figure 10:
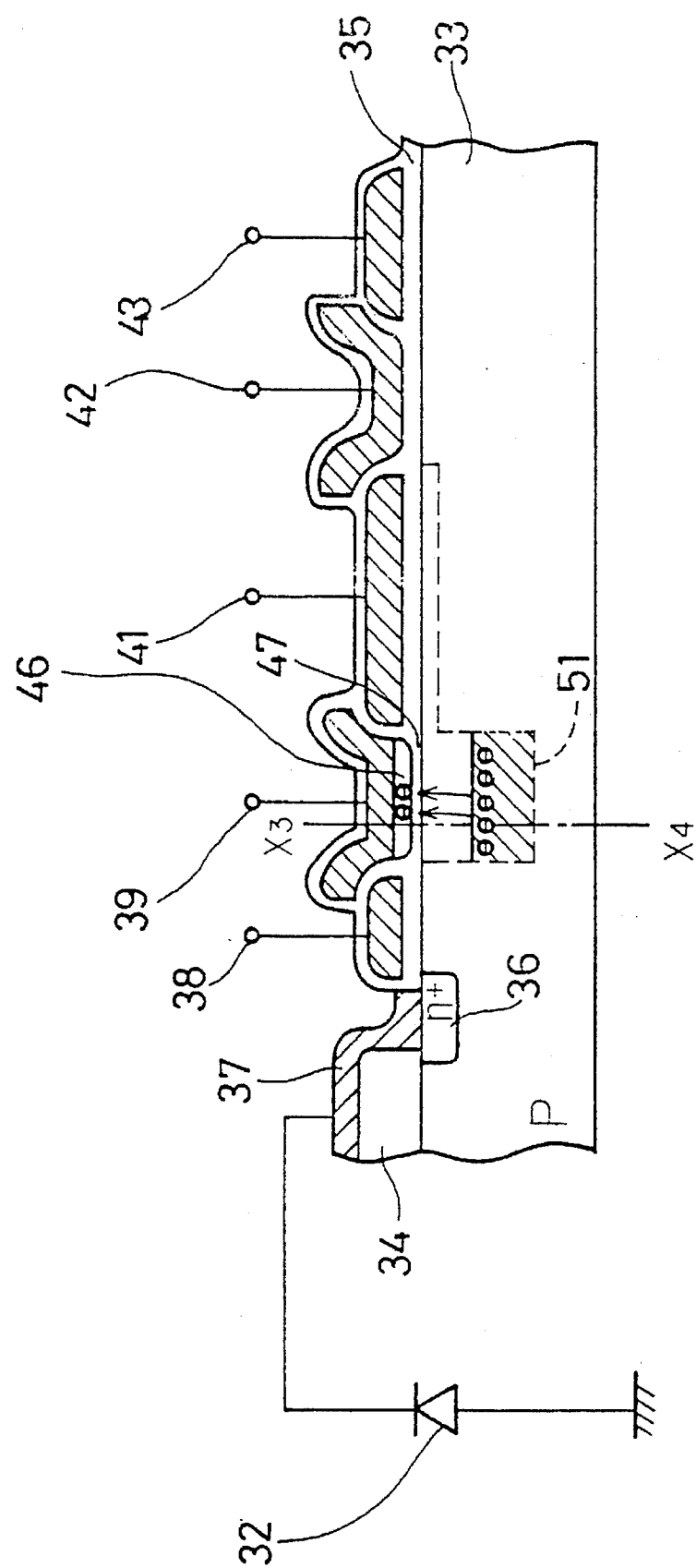
FIG. 10 is a cross sectional view illustrating a solid state image sensing device according to a second embodiment of the present invention.

A description will now be given, with reference to FIGS. 10 and 11, of a second embodiment of the present invention. In FIG. 10, those parts which are the same as those shown in FIG. 3 are given the same reference numbers.

In each input circuit of the solid state image sensing device according to the second embodiment shown in FIG. 10, a multilayer insulating film including an insulating layer 46 made of $Si_3N_4$ and an insulating layer 47 made of $SiO_2$ is formed under the input gate 39 used to supply the bias voltage to the photo-diode 32. In this input circuit, after electric charge corresponding to the dark current of the photo-diode 32 is stored in the potential well 51, the electric charge is injected into a boundary portion between the insulating layers 46 and 47 and the insulating layer 46 itself and trapped therein.

Figure 11:
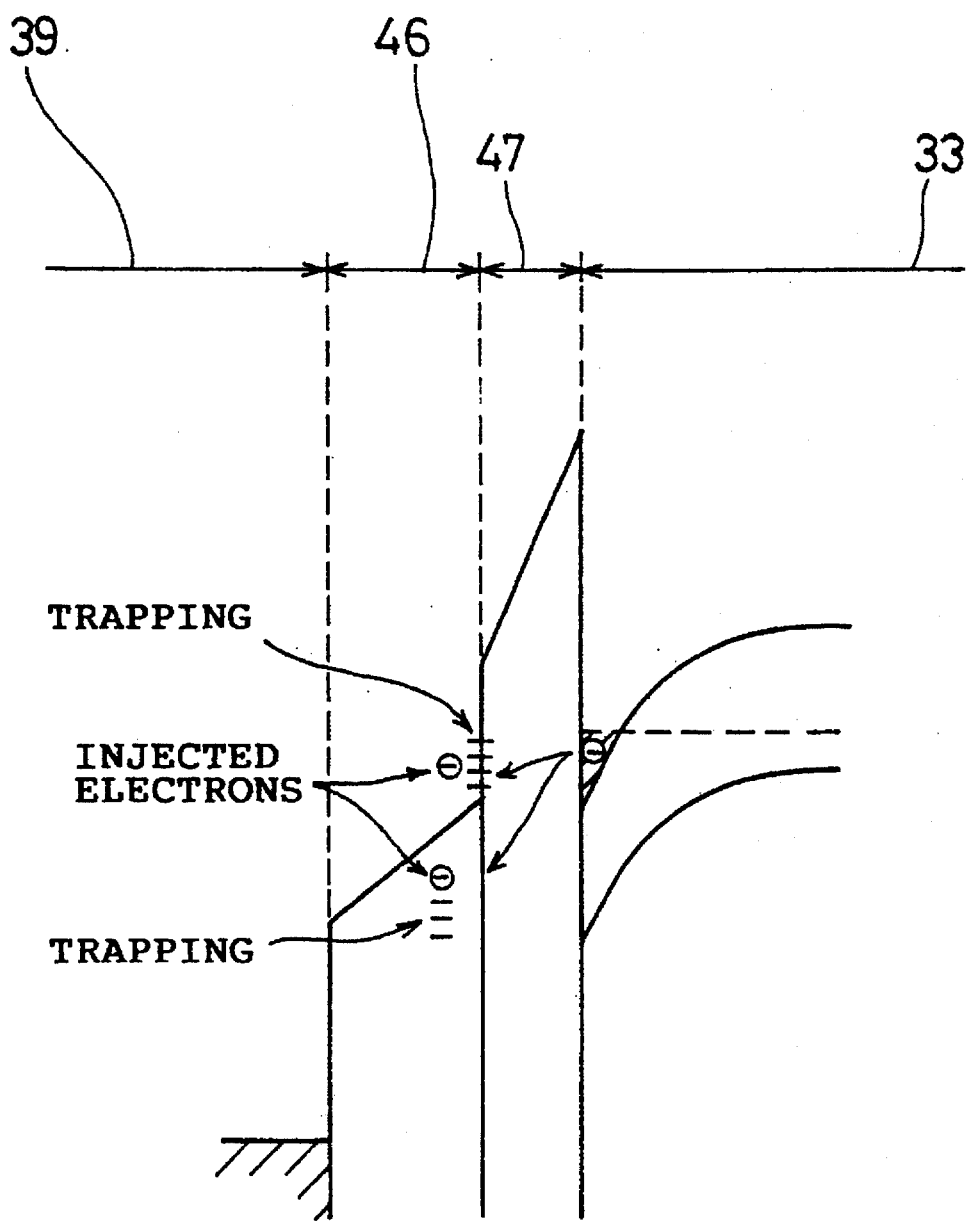
FIG. 11 is a potential diagram illustrating the potential in a section taken along a line X3–X4 shown in FIG. 10.

FIG. 11 shows a potential in a section taken along a line X3–X4 shown in FIG. 10. As shown in FIG. 11, electrons stored in the potential well 51 in the substrate 33 tunnel through the insulating layer 47 and are injected into a charge trapping portion in the boundary between the insulating layers 46 and 47 and the insulating layer 46 itself. The electrons are trapped in the charge trapping portion. The electric charge of the electrons injected into the charge trapping portion is in proportion to the number of electrons stored in the potential well 51, the number of electrons corresponding to the dark current of the photo-diode 32. The operating point of the photo-diode 32 is moved, in the same manner as that described in the first embodiment, in accordance with the amount of electric charge injected into the charge trapping portion in the boundary between the insulating layer 46 and 47 and the insulating layer 46 itself. Thus, in the second embodiment, due to the action of the electric charge stored in the multilayer insulating film including the insulating layers 46 and 47, which electric charge corresponds to the dark current of photo-diode 32 in each pixel, in the imaging operation, the dispersion of the dark currents can be reduced in the same manner as in the first embodiment.

After the electric charge corresponding to the dark current of the photo-diode 32 is stored in the potential well located under the storage electrode 41, the electric charge may be injected into the charge trapping portion in the insulating layers 46 and 47.

Figure 12:
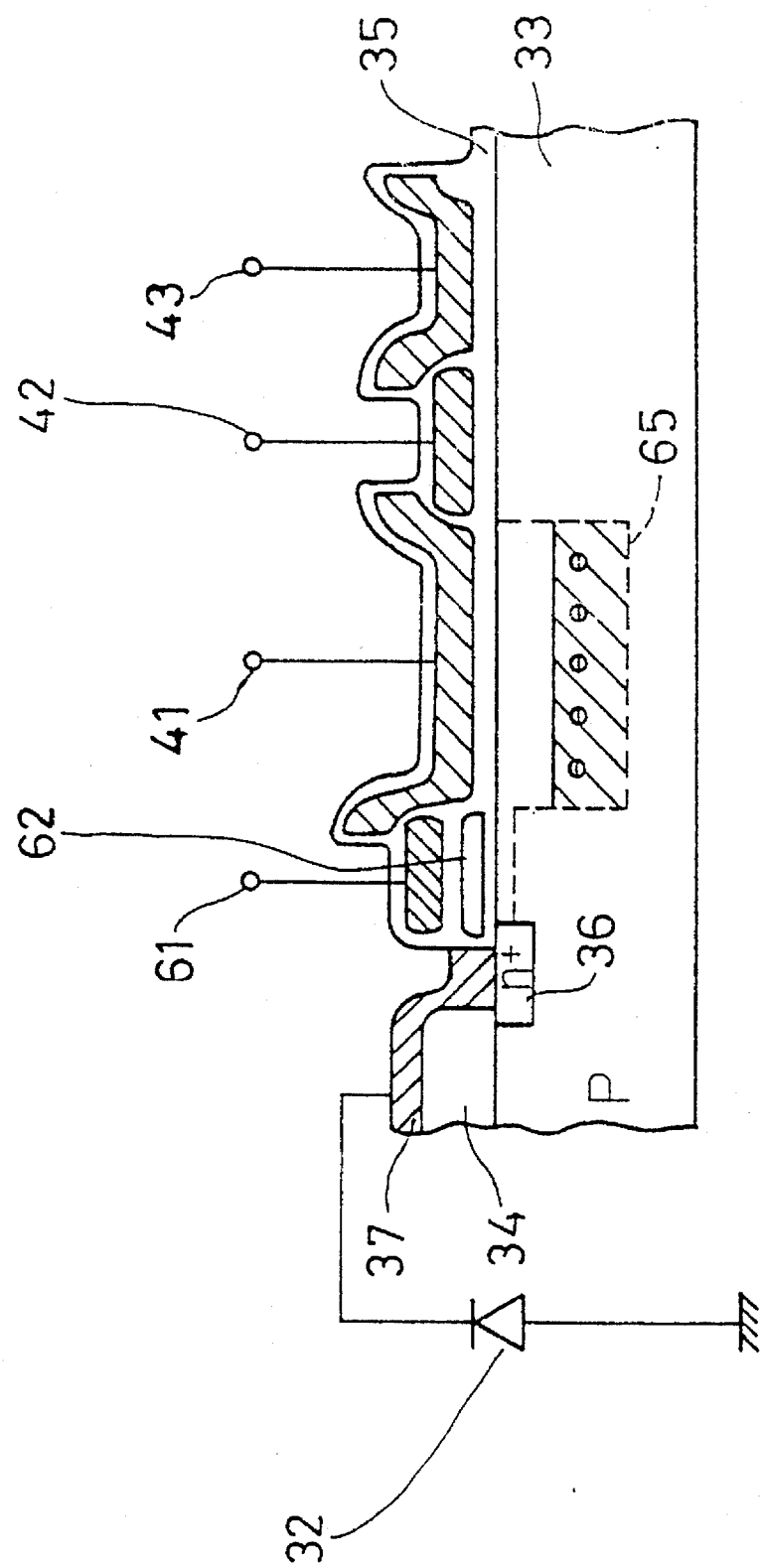
FIGS. 12, 13 and 14 are cross sectional views illustrating a solid state image sensing device according to a third embodiment of the present invention.
Figure 13:
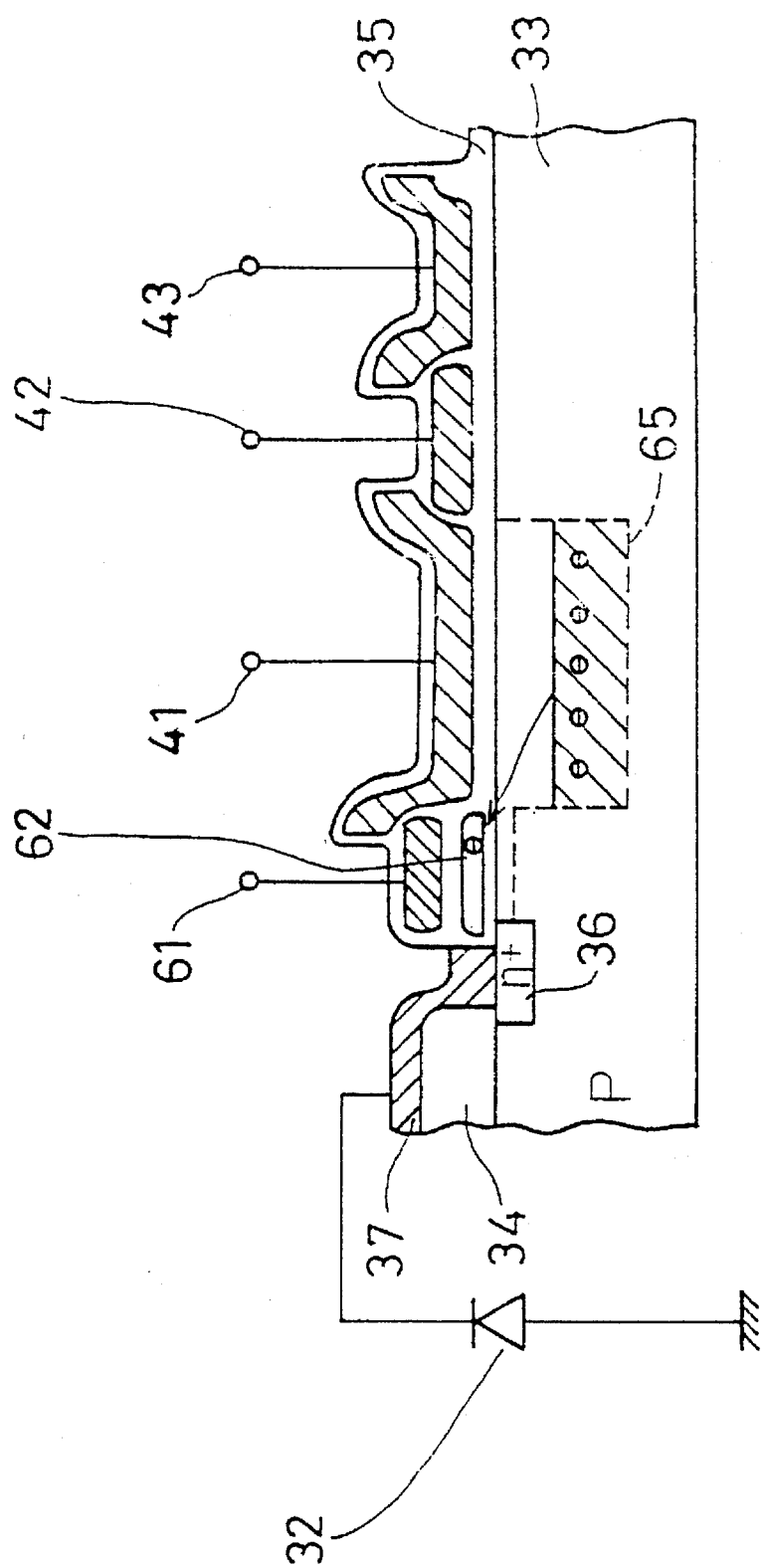
Figure 14:
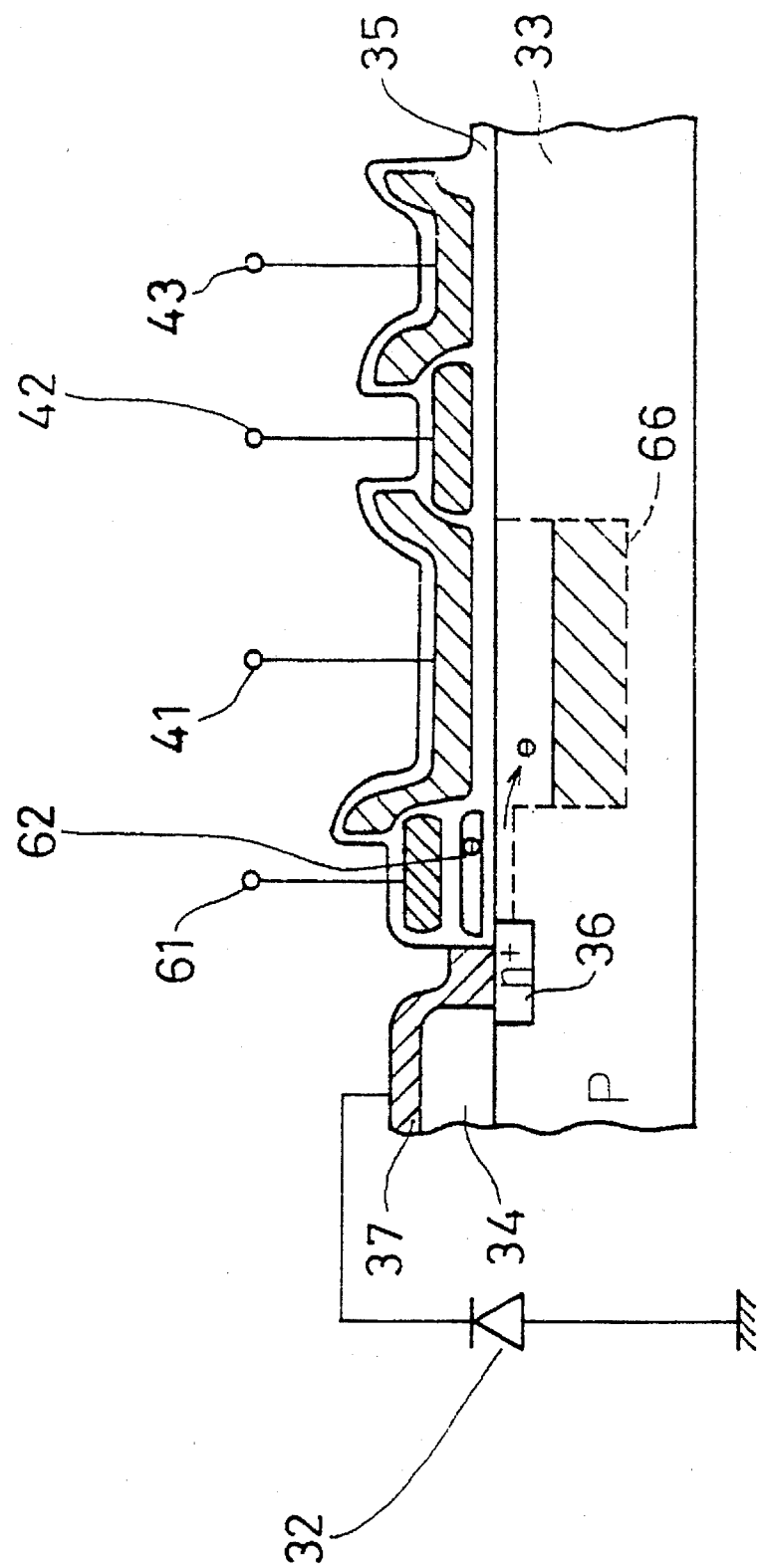

A description will now be given, with reference to FIGS. 12, 13 and 14, of a third embodiment of the present invention. In FIGS. 12, 13 and 14, those parts which are the same as those shown in FIG. 3 are given the same reference numbers.

Referring to FIGS. 12, 13 and 14, an input gate electrode 61, the storage electrode 41, the transfer gate electrode 42 and the transmission portion electrode 43 of the vertical CCD 12 are stacked on a structure including the substrate 33 and the insulating film 35 so as to be separated from the substrate 33 by the insulating film 35. The input gate electrode 61 is used to control the bias voltage of the photo-diode 32. A floating electrode 62 is formed in the insulating film 35 under the input gate 61. The floating gate 62 has the function of correcting the bias voltage of the photo-diode 32. The substrate 33 is grounded.

In the third embodiment, electrons corresponding to the dark current of the photo-diode 32 are injected into and stored in the floating electrode 62, and the dark current of the photo-diode 32 is corrected using the electric charge of the electrons stored in the floating electrode 62. The details will be described below.

First, under a condition in which no light is incident on the photo-diode 32, as shown in FIG. 12, the voltage supplied to the input gate electrode 61 is controlled so as to be maintained, for example, at 1 volt so as to correspond to the bias voltage of the photo-diode 32, so that an input gate is opened. In addition, the storage electrode 41 is maintained at a predetermined voltage of about 10 volts so that a potential well 65 is formed under the storage electrode 41. The transfer gate electrode 42 is maintained at 0 volts, so that the transfer gate is shut down. In this state, electrons corresponding to the dark current of the photo-diode 32 are injected into the potential well 65 for a predetermined time.

After this, as shown in FIG. 13, a high voltage of about 50 volts is supplied to the input gate electrode 61, so that the electrons stored in the potential well 65 are injected into the floating electrode 62. The electric charge Q of the electrons injected into the floating electrode 65 is in proportion to the number of electrons, corresponding to the dark current of the photo-diode 32, which are stored in the potential well 65.

If the voltage-proof of the photo-diode 32 is low, the anode of the photo-diode 32 is disconnected from the ground line while the electric charge is being injected into the floating electrode.

After the electric charge corresponding to the dark current of the photo-diode 32 is injected into the floating electrode 62 as described above, the imaging operation is carried out under a condition in which light is projected onto the photo-diode 32. FIG. 14 shows a state where signal electric charge is stored in a potential well 66 formed under the storage electrode 41 in the imaging operation. A voltage of about 10 volts is supplied to the storage electrode 41, so that the potential well 66 is formed under the storage electrode 41.

In the imaging operation, the bias voltage of the photo-diode 32 is controlled using the input gate electrode 61. At this time, the operating point of the photo-diode 32 is moved, in the same manner as in the first embodiment, in accordance with the electric charge injected into the floating electrode 62, so that the bias voltage of the photo-diode 32 is varied. Thus, the dispersion of the dark currents of the respective photo-diodes in the solid state image sensing device is reduced, and signal electric charge including a component corresponding to a dark current is stored in the potential well 66 for each pixel.

According to the third embodiment, the dispersion of the dark currents of the photo-diodes in the solid state image sensing device is reduced, in the imaging operation, by the electric charge corresponding to each of the dark currents, stored in the floating electrode 62.

Figure 15:
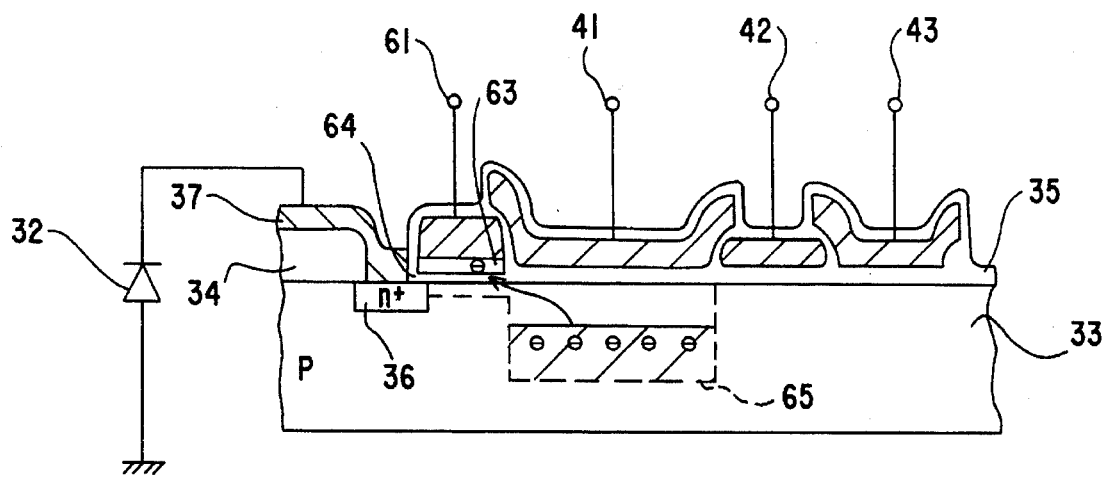
FIG. 15 is a cross sectional view illustrating a solid state image sensing device according to a fourth embodiment of the present invention.

A description will now be given, with reference to FIG. 15, of a fourth embodiment of the present invention. In FIG. 15, those parts which are the same as those shown in FIG. 12 are given the same reference numbers.

In each input circuit of the solid state image sensing device according to the fourth embodiment shown in FIG. 15, a multilayer insulating film including an insulating layer 63 made of $Si_3N_4$ and an insulating layer 64 made of $SiO_2$ is formed under the input gate 61 used to supply the bias voltage to the photo-diode 32. In this input circuit, after electric charge corresponding to the dark current of the photo-diode 32 is stored in the potential well 65, the electric charge is injected into a boundary portion between the insulating layers 63 and 64 and the insulating layer 46 itself and trapped therein. The electric charge of the electrons injected into a charge trapping portion in the multilayer insulating film is in proportion to the number of electrons, corresponding to the dark current of the photo-diode 32, stored in the potential well 65.

The operating point of the photo-diode 32 is moved, in the same manner as in the third embodiment, in accordance with the amount of electric charge injected into the charge trapping portion in the boundary between the insulating layers 63 and 64 and the insulating layer 63 itself. Thus, the dispersion of the dark currents of the photo-diodes in the solid state image sensing device can be reduced, in the same manner as in the third embodiment, by the electric charge trapped in the multilayer insulating film including the insulating layers 63 and 64 for each pixel, in the imaging operation.

A description will now be given, with reference to FIGS. 16, 17, 18 and 19, of a fifth embodiment of the present invention. In FIGS. 16, 17, 18 and 19, those parts which are the same as those shown in FIG. 3 are given the same reference numbers.

Referring to FIGS. 16, 17, 18 and 19, an input gate electrode 38, the storage electrode 41, a transfer gate electrode 71 and the transmission portion electrode 43 of the vertical CCD 12 are stacked on a structure including the substrate 33 and the insulating film 35 so as to be separated from the substrate 33 by the insulating film 35. The input gate electrode 38 is used to control the bias voltage of the photo-diode 32. A floating electrode 72 is formed in the insulating film 35 under the transfer gate electrode 71. The floating gate 72 has a function for correcting the amount of signal electric charge to be supplied to the transmission portion in accordance with the characteristic of the photo-diode 32. The substrate 33 is grounded.

In the fifth embodiment, electrons corresponding to the dark current of the photo-diode 32 are injected into and stored in the floating electrode 72, and the amount of the signal electric charge to be transmitted to the transmission portion of the vertical CCD 12 is corrected using the electric charge of the electrons stored in the floating electrode 72. The details will be described below.

Figure 16:
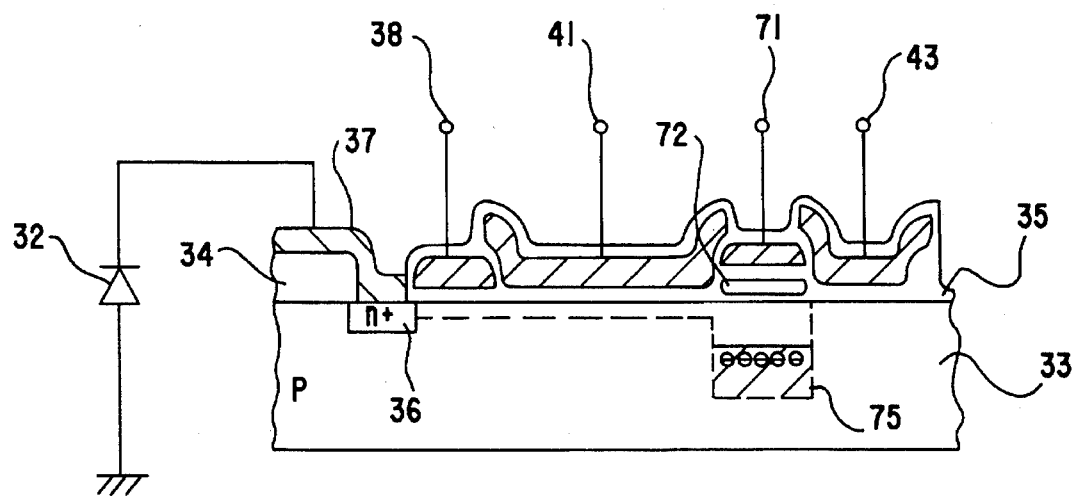
FIGS. 16, 17, 18 and 19 are cross sectional views illustrating a solid state image sensing device according to a fifth embodiment of the present invention.

First, under a condition in which no light is incident on the photo-diode, as shown in FIG. 16, a voltage supplied to the input gate electrode 38 is controlled so as to be maintained, for example, at 1 volt so as to correspond to the bias voltage of the photo-diode 32, so that the input gate is opened. In addition, a voltage of about 10 volts is supplied to the transfer gate electrode 71, so that a potential well 75 is formed under the transfer gate electrode 71. A voltage of 0 volts is supplied to the transmission portion electrode 43, so that the transfer gate is shut down. In the above state, electrons corresponding to the dark current of the photo-diode 32 are stored in the potential well 75 for a predetermined time.

Figure 17:
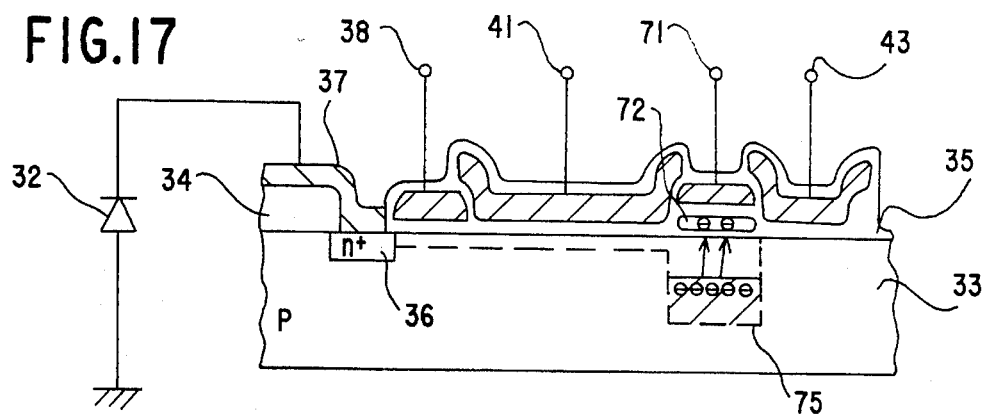

Subsequently, as shown in FIG. 17, in a state where a voltage of 0 volts is supplied to the input gate electrode 38 so that the input gate is shut down, a high voltage of about 50 volts is supplied to the transfer gate electrode 71, so that the electrons stored in the potential well 75 are injected into the floating electrode 72. The electric charge of the electrons injected into the floating electrode 72 is in proportion to the number of electrons, corresponding to the dark current of the photo-diode 32, stored in the potential well 75.

Figure 18:
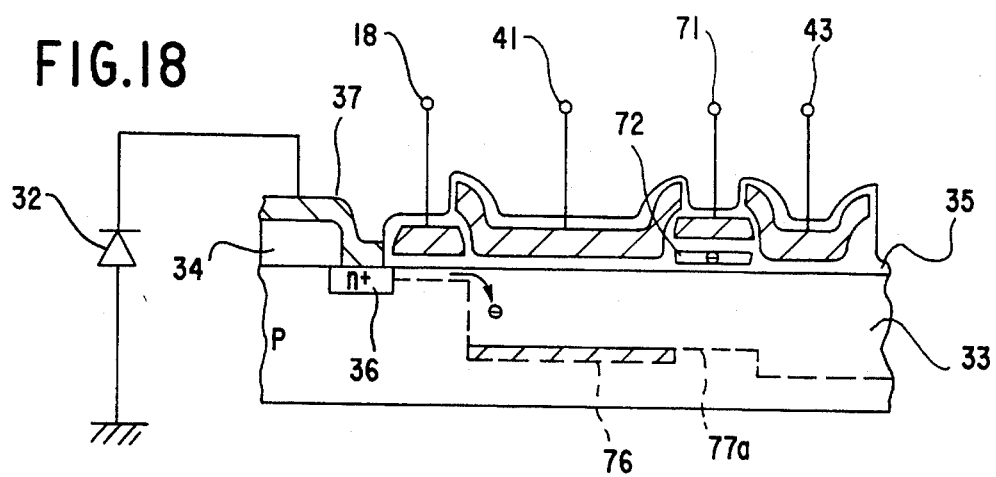
Figure 19:
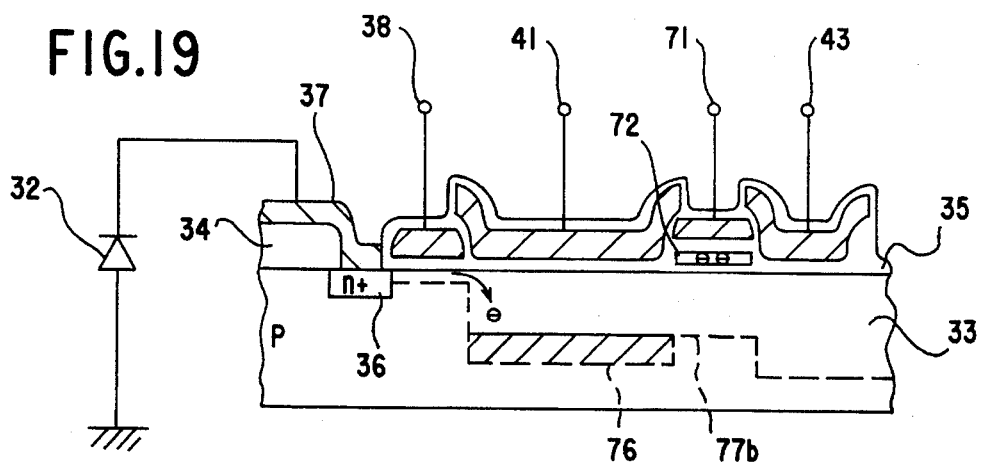

After the electric charge corresponding to the dark current is stored in the floating electrode 72 as has been described above, the light is projected onto the photo-diode 32 and the imaging operation is carried out. FIGS. 18 and 19 show states where the transmission of signal electric charge is performed in the imaging operation.

In the imaging operation, due to voltage control of the input gate electrode 38, the bias voltage of the photo-diode 32 is controlled at a predetermined value. A voltage of about 10 volts is supplied to the storage electrode 41 and a voltage of 0 volts is supplied to the transfer gate electrode 71 so that the transfer gate is shut down. As a result, the signal electric charge is stored in a potential well 76 located under the storage electrode 41 as shown in FIG. 18.

After the signal electric charge is stored in the potential well 76, a voltage supplied to the transfer gate electrode 71 is controlled at a predetermined value which is approximately equal to that of the voltage supplied to the storage electrode 41 so that the transfer gate is opened. The voltage supplied to the transmission portion electrode 43 is then controlled so as to be higher than the voltage supplied to the transfer gate electrode 71. At this time, if the dark current of the photo-diode is equal to zero, the potential of a portion under the transfer gate electrode 71 is equal to the potential of the bottom of the potential well 76 located under the storage electrode 41. As a result, the entire signal electric charge stored in the potential well 76 is transferred to the transmission portion via the transmission gate.

Since the actual dark current of the photo-diode 32 is not equal to zero, the electric charge corresponding to the value of the dark current is injected into the floating electrode 72. Thus, the potential barrier is elevated by the quantity corresponding to the amount of electric charge injected into the floating electrode 72. As a result, the electric charge corresponding to the dark current of the photo-diode 32 remains in the potential well 76 located under the storage electrode 41, and the signal electric charge corresponding to only the amount of light projected onto the photo-diode 32 is transferred to the transmission portion of the vertical CCD 12 via the transmission gate.

FIG. 18 shows a case where a small dark current is generated by the photo-diode 32. In this case, only a small amount of electric charge is injected into the floating electrode 72, so that the potential barrier of the portion located under the transfer gate electrode 71 is low. Thus, a small amount of electric charge corresponding to the dark current remains in the potential well 76 located under the storage electrode 41.

On the other hand, FIG. 19 shows a case where a large dark current is generated by the photo-diode 32. In this case, a large amount of electric charge is injected into the floating electrode 72, so that the potential barrier of the portion located under the transfer gate electrode 71 is high. Thus, a large amount of electric charge corresponding to the dark current of the photo-diode 32 remains in the potential well 76 located under the storage electrode 41.

Figure 20:
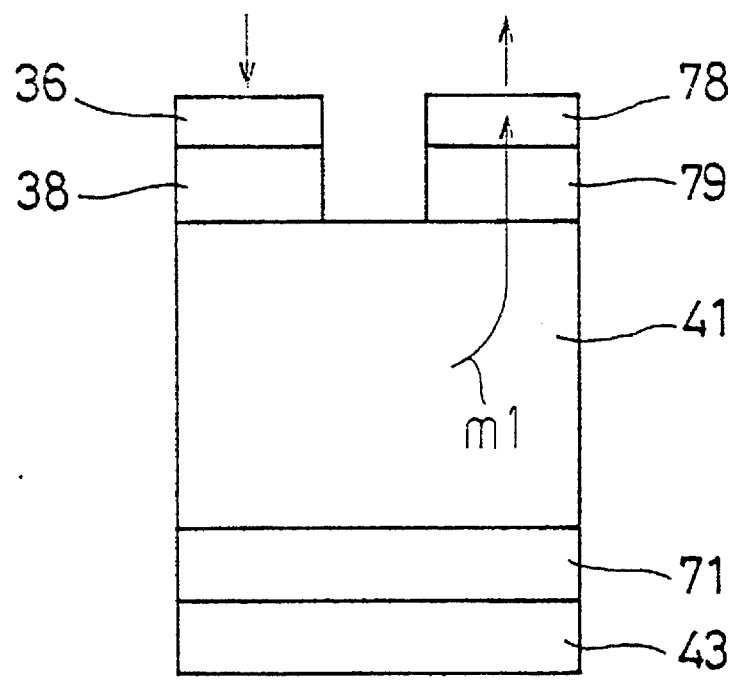
FIG. 20 is a plan view illustrating the solid state image sensing device according to the fifth embodiment of the present invention.

FIG. 20 shows a state where the electrons remaining in the potential well 76 move. That is, after the transferring of the signal electric charge is completed, the electrons remaining in the potential well 76 passes, as shown by an arrow ml in FIG. 20, thorough an ejecting gate located under an ejecting gate electrode 79 and are ejected from an ejecting drain electrode 78.

As has been described above, according to the fifth embodiment, due to the operation of the floating electrode 72 in which the electric charge corresponding to the dark current of the photo-diode 32 is stored, the signal electric charge to which the correction regarding the dark current is applied can be transferred to the transmission portion in the imaging operation. Thus, the solid state image sensing device can generate output signals to which the correction regarding the dark currents is applied. In addition, it is prevented that each stage in the transmission portion is saturated with the electric charge by the dark current and the electric charge further overflows into the next stage.

After the electric charge corresponding to the dark current of the photo-diode 32 is stored in the potential well formed under the storage electrode 41, this electric charge may be injected into the floating electrode 72.

Figure 21:
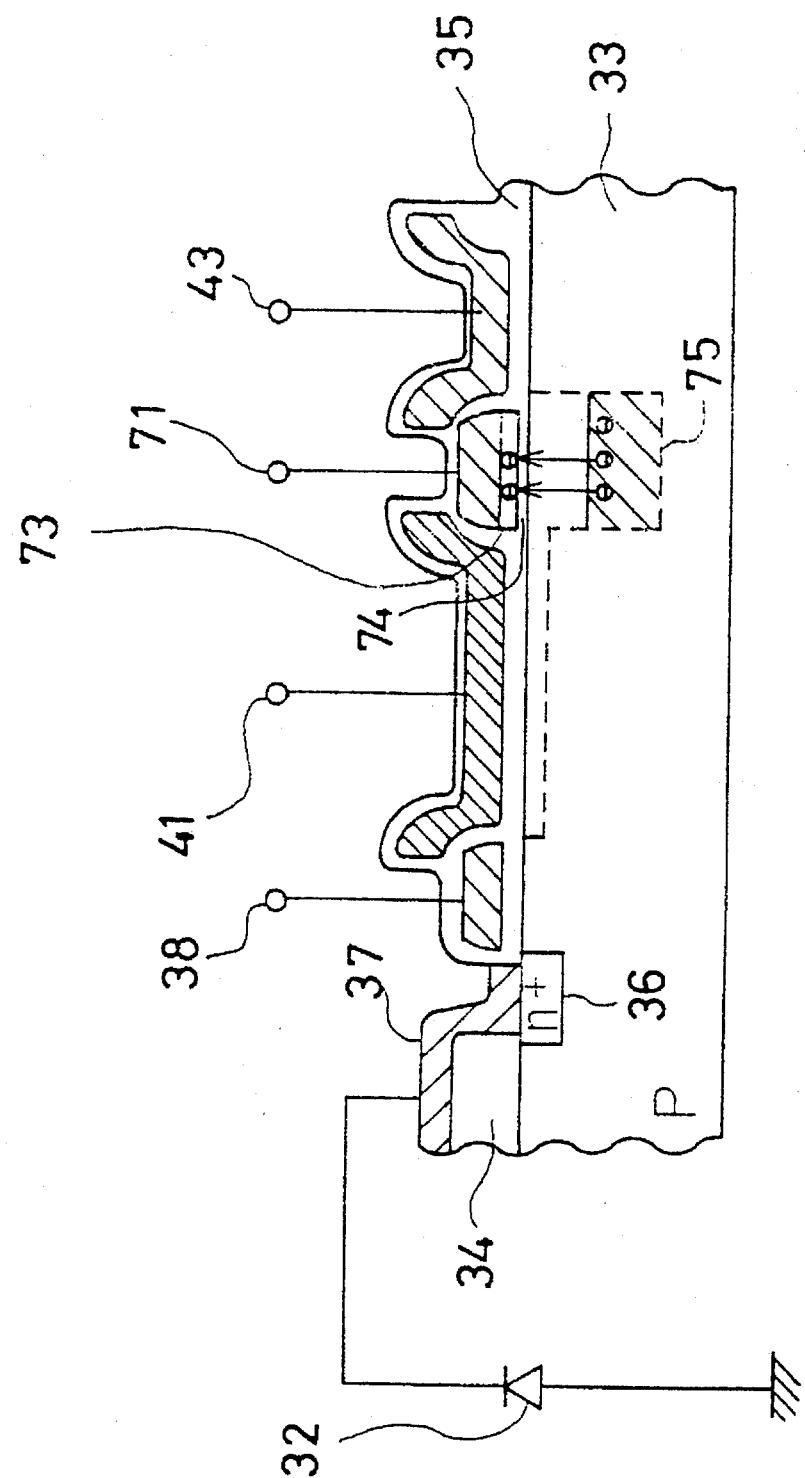
FIG. 21 is a cross sectional view illustrating a solid state image sensing device according to a sixth embodiment of the present invention.

A description will now be given, with reference to FIG. 21, of a sixth embodiment of the present invention. In FIG. 21, those parts which are the same as those shown in FIG. 16 are given the same reference numbers. In the sixth embodiment shown in FIG. 21, a multilayer insulating film having an insulating layer 73 made of $Si_3N_4$ and an insulating layer 74 made of $SiO_2$ is formed under the transfer gate electrode 71.

In the sixth embodiment, after the electric charge corresponding to the dark current of the photo-diode 32 is stored in the potential well 75, the electric charge is injected into a charge trapping portion in the boundary between the insulating layers 73 and 74 and the insulating layer 73 itself and maintained therein. The amount of the electric charge injected into the charge trapping portion is in proportion to the number of electrons, corresponding to the dark current of the photo-diode 32, stored in the potential well 75.

The height of the potential barrier of the transfer gate in the imaging operation is controlled, in the same manner as in the fifth embodiment, in accordance with the amount of electric charge injected into the charge trapping portion in the boundary between the insulating layers 73 and 74 and the insulating layer 73 itself. Thus, due to the operation of the multilayer insulating film having the insulating layers 73 and 74 in which the electric charge corresponding to the dark current is injected, the signal electric charge to which the correction regarding the dark current is applied can be transferred to the transmission portion, in the same manner as in the fifth embodiment.

Figure 22:
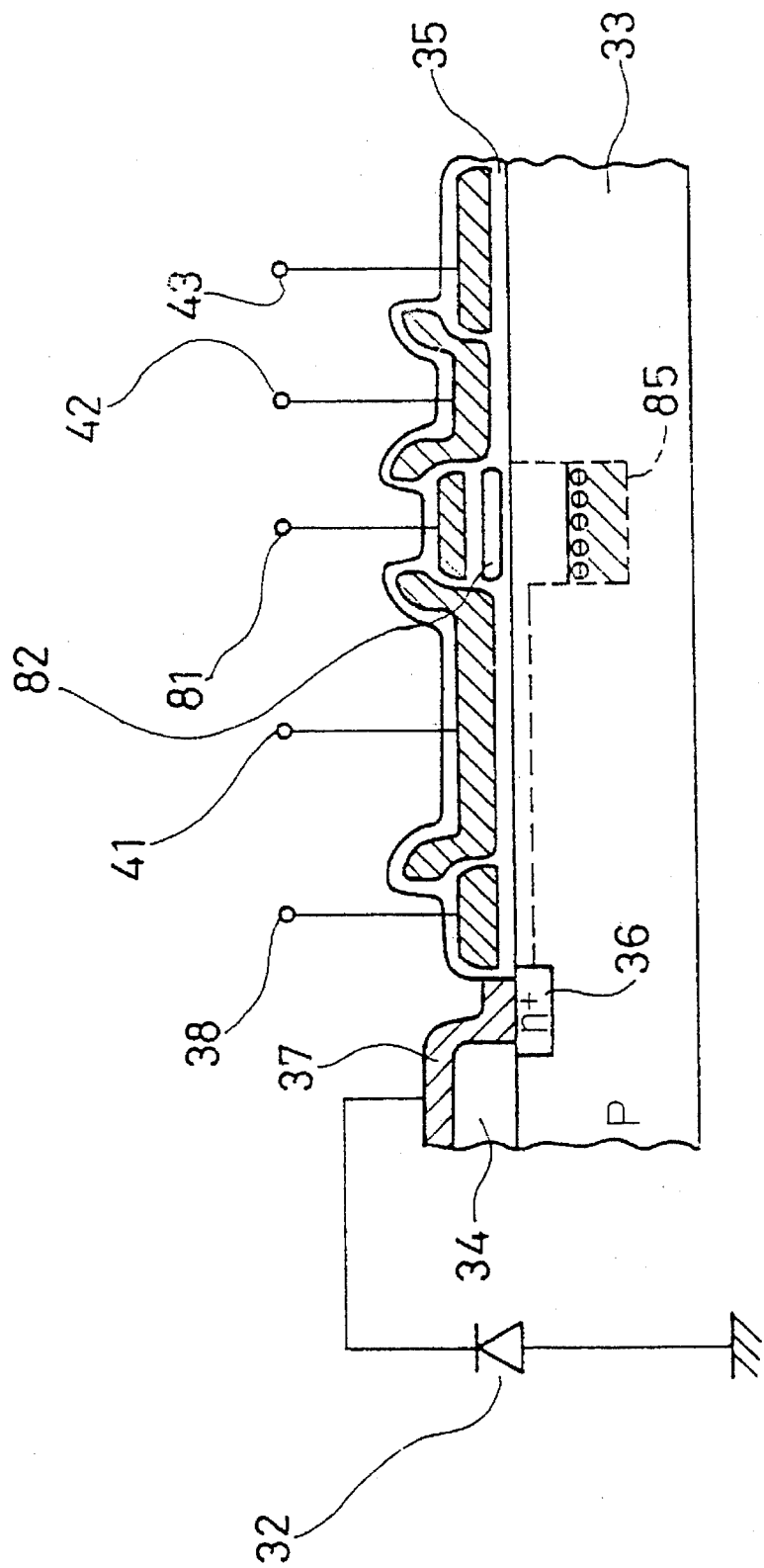
FIGS. 22, 23 and 24 are cross sectional views illustrating a solid state image sensing device according to a seventh embodiment of the present invention.
Figure 23:
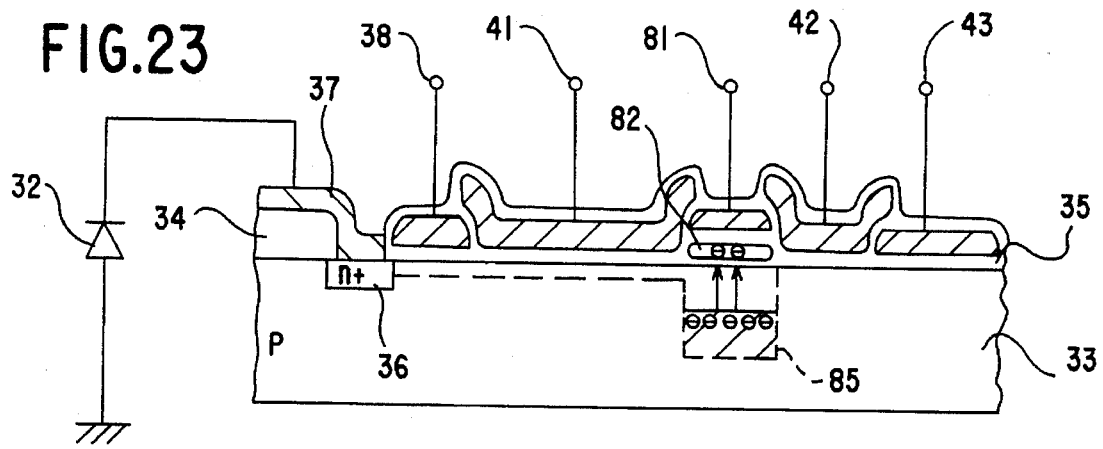
Figure 24:
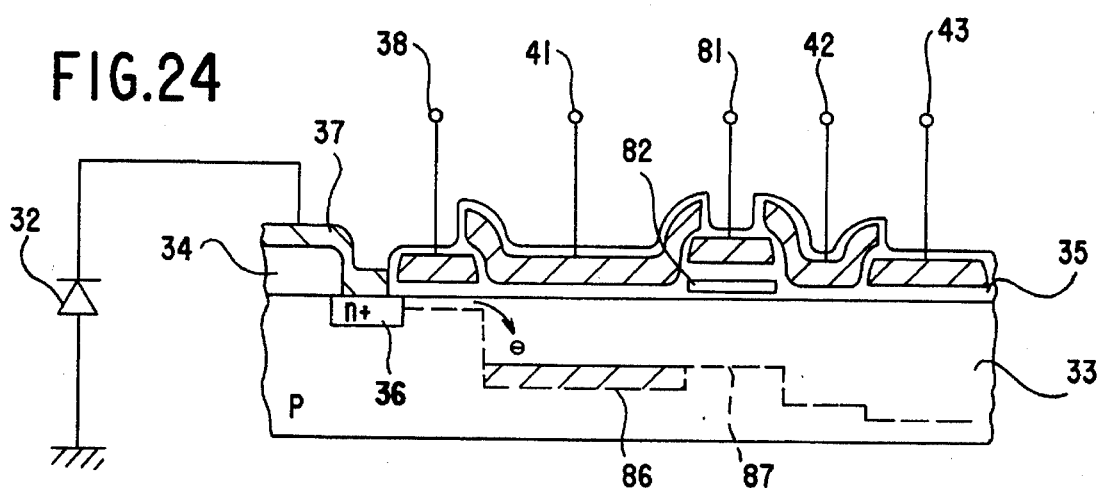

A description will now be given, with reference to FIGS. 22, 23 and 24, of a seventh embodiment of the present invention. In FIGS. 22, 23 and 24, those parts which are the same as those shown in FIG. 16 are given the same reference numbers.

Referring to FIGS. 22, 23 and 24, a skimming gate electrode 81 is provided between the storage electrode 41 and the transfer gate electrode 42. A floating electrode 82 is formed in the insulating layer 35 under the skimming gate electrode 81. The floating gate 82 is used to control the amount of the signal electric charge to be output in accordance with the characteristic of the photo-diode 32. The substrate is grounded.

In the seventh embodiment, electrons corresponding to the dark current of the photo-diode 32 are injected into and maintained in the floating electrode 82, and the amount of signal electric charge transferred to the transmission portion of the vertical CCD 12 is controlled by the electric charge stored in the floating electrode. The details will be described bellow.

First, as shown in FIG. 22, a voltage supplied to the input gate electrode 38 is controlled so as to correspond to the bias voltage of the photo-diode 32, so that the input gate is opened. The storage electrode 41 is maintained at a voltage approximately equal to the voltage supplied to the input gate electrode 38. The skimming gate electrode is controlled so as to be maintained at a predetermined voltage of about 10 volts so that a potential well 85 is formed under the skimming gate electrode 81. The transfer gate electrode 42 is maintained at 0 volts so that the transfer gate is shut down. In the above state, electrons corresponding to the dark current of the photo-diode 32 are stored in the potential well 85 for a predetermined time.

Subsequently, as shown in FIG. 23, in a state where the input gate electrode 38 is maintained at 0 volts so that the input gate is shut down, a high voltage of about 50 volts is supplied to the skimming gate electrode 81, so that the electrons stored in the potential well 85 are injected into the floating electrode 82. The electric charge injected into the floating electrode 82 is in proportion to the number of electrons, corresponding to the dark current of the photo-diode 32, stored in the potential well 85.

After the electric charge is stored in the floating electrode 82 as described above, light is projected onto the photo-diode 32 and the imaging operation is performed. FIG. 24 shows the structure of each pixel in the solid state image sensing device in the imaging operation.

In the imaging operation, the bias voltage of the photo-diode 32 is controlled so as to be maintained at a predetermined value using the input gate electrode 38. A predetermined voltage of about 10 volts is supplied to the storage electrode 41, and the transfer gate electrode 42 is provided with 0 volts so that the transfer gate is shut down. As a result, the signal electric charge is stored in the potential well 86 located under the storage electrode 41.

After the signal electric charge is completely stored in the potential well 86, the voltage of the skimming gate electrode 81 in each input circuit is controlled so as to be maintained at a predetermined value slightly less than that of the voltage supplied to the storage electrode 41, so that the skimming gate is opened. In addition, the transfer gate electrode 42 and the transmission portion electrode 43 are provided with voltages each of which is greater than the voltage supplied to the skimming gate electrode 81. At this time, the electric charge corresponding to the dark current has been injected into the floating electrode 82, so that the potential barrier of a portion located under the skimming gate electrode 81 is elevated by the quantity corresponding to the electric charge injected into the floating electrode 82. Thus, the electric charge corresponding to the dark current of the photo-diode 32 remains in the potential well 86 located under the storage electrode 41 and the signal electric charge corresponding to only the amount of light incident on the photo-diode 32 is transferred to the transmission portion of the vertical CCD 12 via the transmission gate. The electric charge which remains in the potential well 86 is ejected, in the same manner as in the sixth embodiment, via the ejecting drain electrode after the transferring of the electric charge is completed.

As has been described above, according to the seventh embodiment, due to the operation of the floating electrode 82 in which the electric charge corresponding to the dark current of the photo-diode 32 is stored, the signal electric charge to which the correction regarding the dark current of the photo-diode 32 is applied can be transferred to the transmission portion in the imaging operation. In addition, since the skimming gate electrode can be controlled to be maintained at a constant voltage, noise hardly affects the solid state image sensing device in comparison with the case of the fifth embodiment in which the electric charge corresponding to the dark current is stored in the portion located under the transfer gate electrode 42.

After the electric charge corresponding to the dark current of the photo-diode 32 is stored in the potential well located under the storage electrode 41, the electric charge may be injected into the floating electrode 82.

Figure 25:
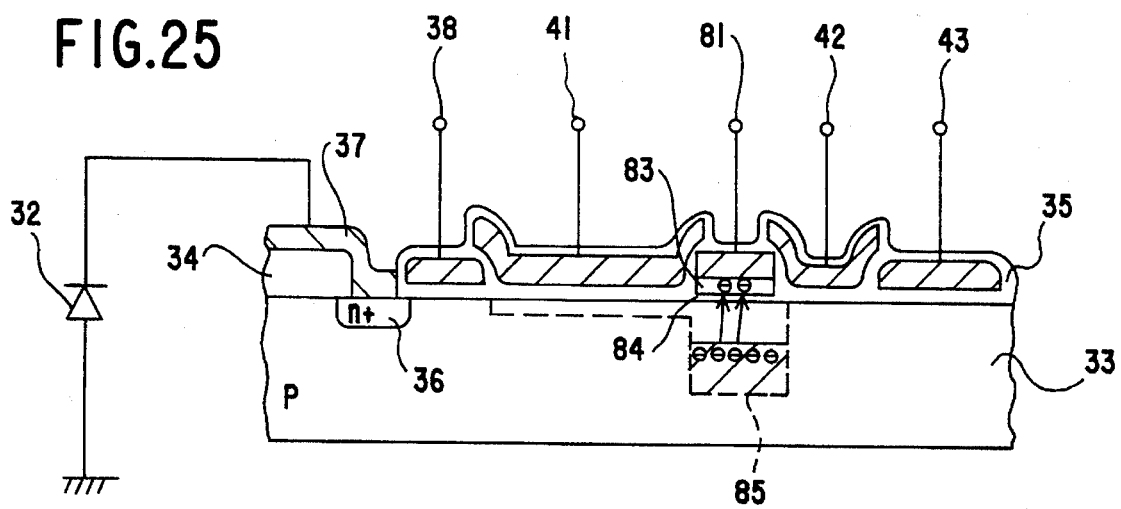
FIG. 25 is a cross sectional view illustrating a solid state image sensing device according to an eighth embodiment of the present invention.

A description will now be given, with reference to FIG. 25, of an eighth embodiment of the present invention. In FIG. 25, those parts which are the same as those shown in FIG. 22 are given the same reference numbers.

Referring to FIG. 25, a multilayer insulating film having an insulating layer 83 made of $Si_3N_4$ and an insulating layer 84 made of $SiO_2$ is formed under the skimming gate electrode 81. In the eighth embodiment, after the electric charge corresponding to the dark current of the photo-diode 32 is stored in the potential well 85, the electric charge is injected into and maintained in the charge trapping portion in the boundary between the insulating layers 83 and 84 and the insulating layer 83 itself. The amount of the electric charge injected into the charge trapping portion is in proportion to the number of electrons, corresponding to the dark current of the photo-diode 32, stored in the potential well 85.

The height of the potential barrier of the skimming gate in the imaging operation is controlled, in the same manner as in the seventh embodiment, in accordance with the amount of electric charge injected into the charge trapping portion in the boundary between the insulating layers 83 and 84 and the insulating layer 83 itself. Thus, due to the insulating layers 83 and 84 in which the electric charge corresponding to the dark current is stored, the signal electric charge to which the correction regarding the dark current of the photo-diode 32 is applied can be transferred to the transmission portion in the imaging operation, in the same manner as in the seventh embodiment.

Figure 26:
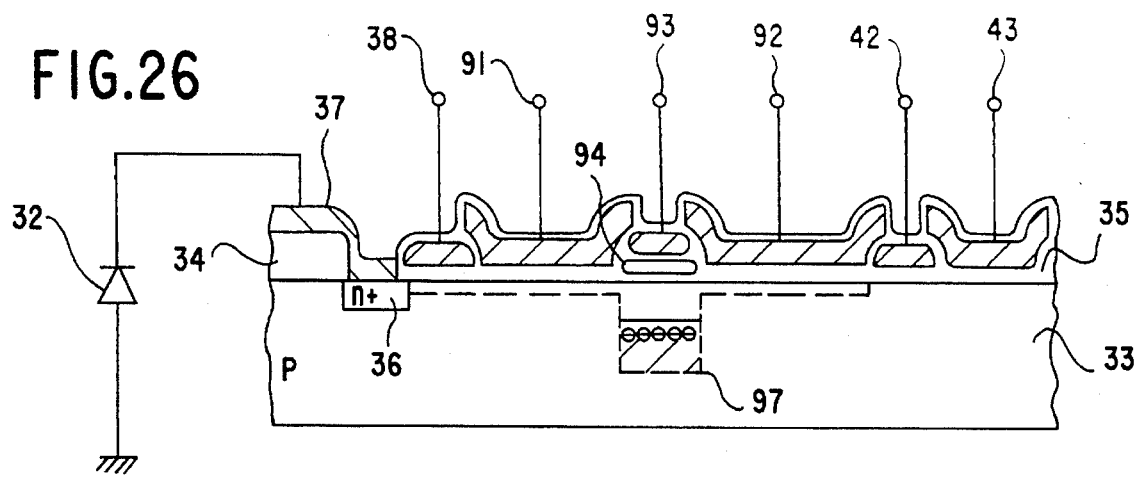
FIGS. 26, 27 and 28 are cross sectional views illustrating a solid state image sensing device according to a ninth embodiment of the present invention.
Figure 27:
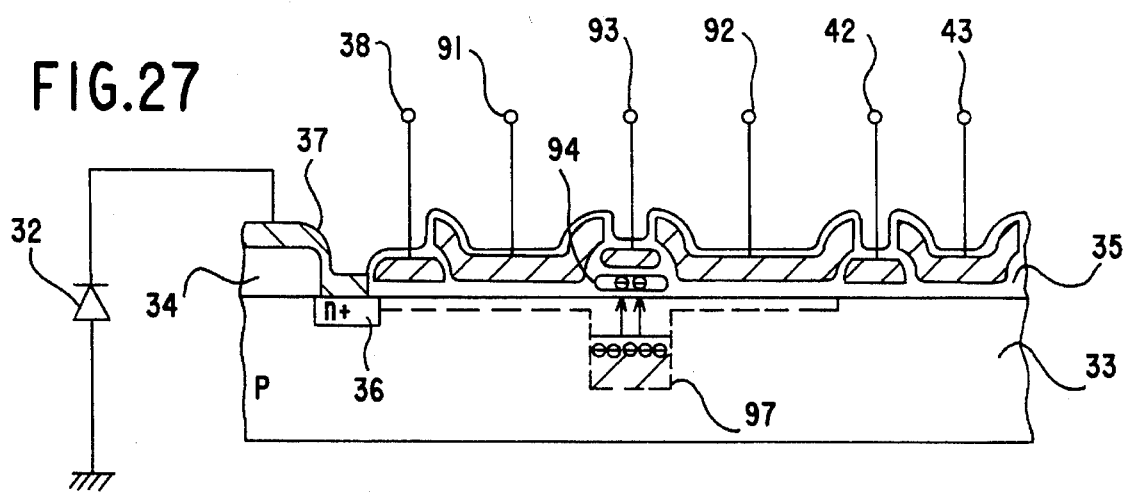
Figure 28:
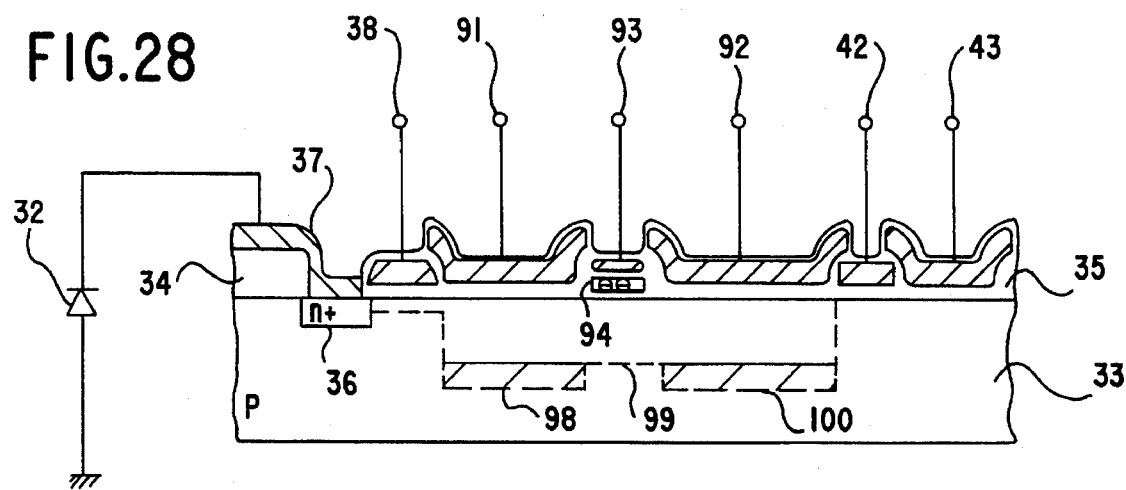

A description will now be given, with reference to FIGS. 26, 27, 28 and 29, of a ninth embodiment of the present invention. In FIGS. 26, 27 and 28, those parts which are the same those shown in FIG. 22 are given the same reference numbers.

Referring to FIGS. 26, 27 and 28, a skimming gate electrode 93 is provided between storage electrodes 91 and 92 so that the storage electrodes 91 and 92 are separated from each other. A floating electrode 94 is formed in the insulating film 35 under the skimming gate electrode 93. The floating electrode 94 is used to control the amount of output signal electric charge in accordance with the characteristic of the photo-electrode 32. The substrate 33 is grounded.

In the ninth embodiment, electrons corresponding to the dark current of the photo-diode 32 are injected into and stored in the floating electrode 93, and due to the electric charge of the electrons stored in the floating electrode 93, the amount of signal electric charge transferred to the transmission portion of the vertical CCD 12 is controlled. The details will be described below.

First, as shown in FIG. 26, the voltage supplied to the input gate electrode 38 is controlled so as to correspond to the bias voltage of the photo-diode 32, so that the input gate is opened. The storage electrode 91 is maintained at a voltage approximately equal to the voltage supplied to the input gate electrode 38. The skimming gate electrode 93 is maintained at a predetermined voltage of about 10 volts so that a potential well 97 is formed under the skimming electrode 93. The transfer gate electrode 42 is maintained at 0 volts so that the transfer gate is shut down. In the above state, electrons corresponding to the dark current of the photo-diode 32 are injected into the potential well 97 for a predetermined time.

After this, as shown in FIG. 27, in a state where the input gate electrode is controlled so as to be maintained at 0 volt so that the input gate is shut down, the skimming gate 93 is maintained at a high voltage of about 50 volts, and the electrons stored in the potential well 97 are injected into the floating electrode 94. The quantity of electric charge of the electrons injected into the floating electrode 94 is in proportion to the number of electrons, corresponding to the dark current of the photo-diode 32, stored in the potential well 97.

After the electric charge corresponding to the dark current of the photo-diode 32 is injected into the floating electrode 94 as described above, light is projected onto the photo-diode 32; and the imaging operation is carried out. FIG. 28 shows a state of the solid state image sensing device in the imaging operation.

In the image operation, the voltage of the input gate electrode 38 is controlled so that the bias voltage of the photo-diode 32 is maintained at a predetermined value. A voltage of about 10 volts is supplied to the storage electrodes 91 and 92. The skimming gate electrode 93 is provided with a voltage which is less than the voltage of the storage electrode 91 by a predetermined value. The transfer gate electrode is maintained at 0 volts so that the transfer gate is shut down. In the above state, the signal electric charge is stored in a potential well 98 located under the storage electrode 91 and a potential well 100 located under the storage electrode 92.

After the signal electric charge is completely stored in the potential wells 98 and 100, the transfer gate electrode 42 is controlled so as to be maintained at a voltage greater than the voltage of the storage electrode 92 so that the transfer gate is opened. At this time, the electric charge corresponding to the dark current of the photo-diode 32 has been injected into the floating electrode 94, so that the potential barrier 99 of a portion under the skimming gate electrode 93 is elevated by the quantity corresponding to the amount of electric charge injected into the floating electrode 94. Thus, the electric charge corresponding to the dark current of the photo-diode 32 remains in the potential well 98 located under the storage electrode 91, and the signal electric charge corresponding to only the amount of light incident to the photo-diode is transferred from the potential well 100 located under the storage electrode 92 to the transmission portion of the vertical CCD 12 via the transmission gate.

Figure 29:
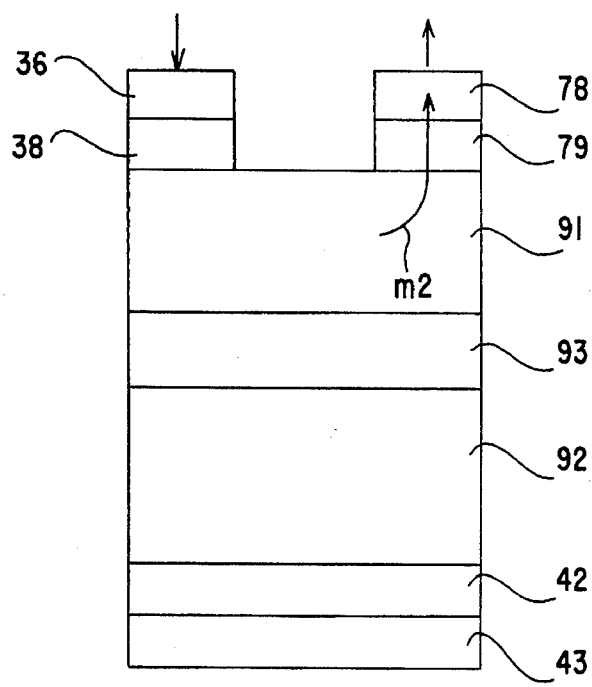
FIG. 29 is a plan view illustrating the solid state image sensing device according to the ninth embodiment of the present invention.

FIG. 29 shows a state where the electric charge remaining in the potential well 98 moves. That is, after the transferring of the signal electric charge is completed, the electric charge which remains in the potential well 76 passes, as shown by an arrow m2 in FIG. 29, thorough an ejecting gate located under an ejecting gate electrode 79 and is ejected from an ejecting drain electrode 78.

As described above, according to the ninth embodiment, due to the floating electrode 94 in which the electric charge corresponding to the dark current of the photo-diode 32 is stored, the signal electric charge to which the correction regarding the dark current of the photo-diode is applied can be transferred to the transmission portion in the imaging operation.

After the electric charge corresponding to the dark current of the photo-diode 32 is stored in the potential well formed under the storage electrode 91, this electric charge may be injected into the floating electrode 94.

Figure 30:
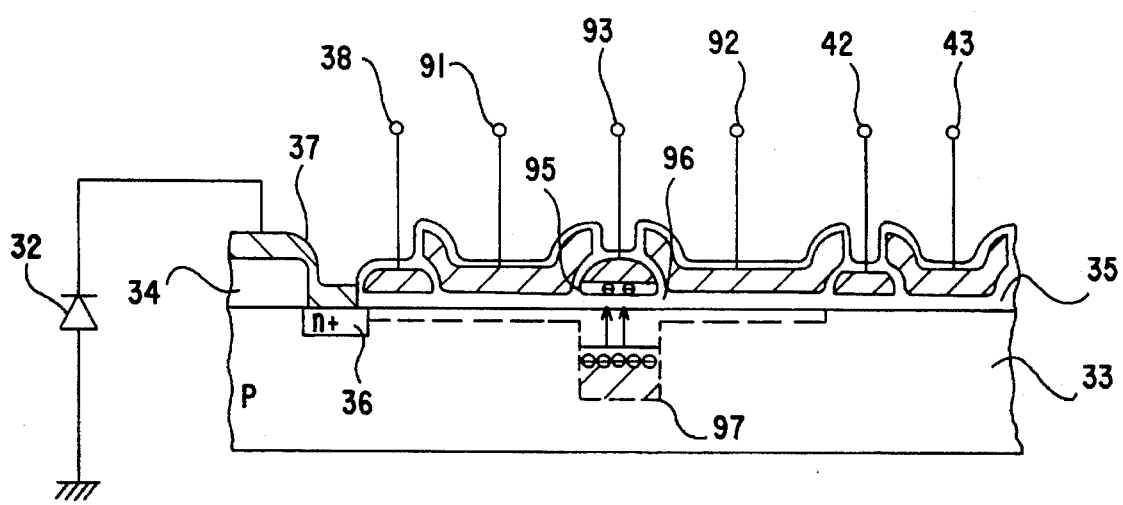
FIG. 30 is a cross sectional view illustrating a solid state image sensing device according to a tenth embodiment of the present invention.

A description will now be given, with reference to FIG. 30, of a tenth embodiment of the present invention. In FIG. 30, those parts which are the same as those shown in FIG. 26 are given the same reference numbers. Referring to FIG. 30, a multilayer insulating film having an insulating layer 95 made of $Si_3N_4$ and an insulating layer 96 made of $SiO_2$ is formed under the skimming gate electrode 93.

In the tenth embodiment, after the electric charge corresponding to the dark current of the photo-diode 32 is stored in the potential well 97, the electric charge stored therein is injected into and maintained in the charge trapping region in the boundary between the insulating layers 95 and 96 and the insulating layer 95 itself. The amount of electric charge injected into the charge trapping region is in proportion to the number of electrons, corresponding to the dark current of the photo-diode 32, stored in the potential well 97.

The height of the potential barrier of the skimming gate in the image operation is changed, in the same manner as in the ninth embodiment, in accordance with the amount of electrical charge injected into the charge trapping region in the boundary between the insulating layers 95 and 96 and the insulating layer 95 itself. Thus, due to the insulating layers 95 and 96 in which the electric charge corresponding to the dark current of the photo-diode 32 is stored, the signal electric charge to which the correction regarding the dark current of the photo-diode 32 is applied can be transferred to the transmission portion in the imaging operation in the same manner as in the ninth embodiment.

A description will now be given, with reference to FIGS. 31, 32, 33 and 34, of an eleventh embodiment of the present invention.

Figure 33:
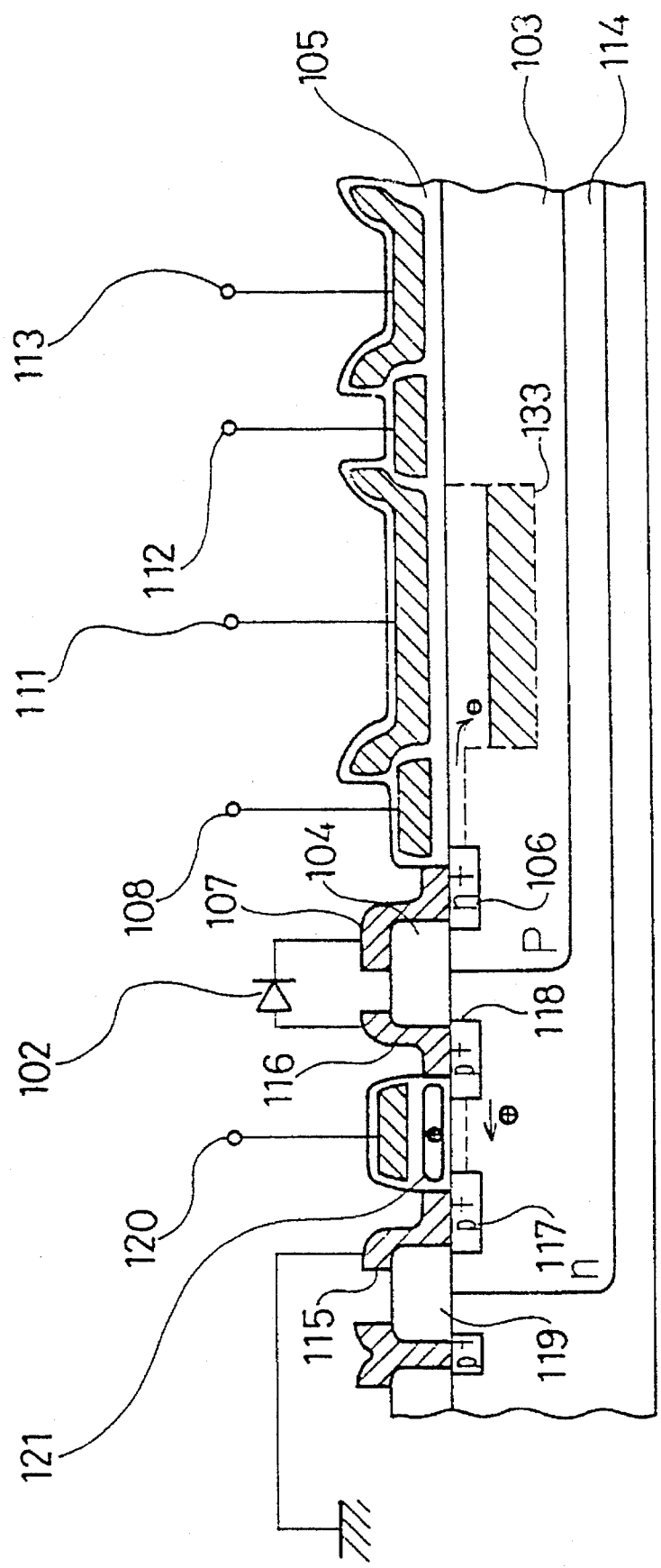

Referring to FIG. 33, p-type regions 117 and 118 are formed in an n-type substrate 114 so as to be close to the surface of the n-type substrate 114. The p-type region 115 is connected to the ground line via an electrode 115. A gate electrode 120 covered by an insulating film 126 is formed between the p-type regions 117 and 118. A floating electrode 121 is formed in the insulating film 126 under the gate electrode 120. The gate electrode 120 is used to control the bias voltage of a photo-diode 102. The floating gate 121 is used to correct the bias voltage in accordance with the characteristic of the photo-diode 102.

An n-type region 106 and an insulating film 104 which are parts of an input diode are formed in a p-type substrate 103 so as to be close to the surface of the p-type substrate 103. The n-type region 106 is connected to the photo-diode 102 corresponding to a pixel via a diode connecting electrode 107. The anode of the photo-diode 102 is connected to the p-type region 118 via a diode connecting electrode 116. An input gate 108 to which an original voltage for the bias voltage of the photo-diode 102 is to be supplied, a storage electrode 111, a transfer gate electrode 112 and a transmission portion electrode 113 of the vertical CCD 12 are formed on a structure including the substrate 103 and an insulating film 105 made of $SiO_2$ so as to be separated from the substrate 103 by the insulating film 105.

In the eleventh embodiment, holes corresponding to the dark current of the photo-diode 102 are injected into the floating electrode 121, and the dark current of the photo-diode 102 is controlled by the holes injected into the floating electrode 121. The details are described below.

Figure 31:
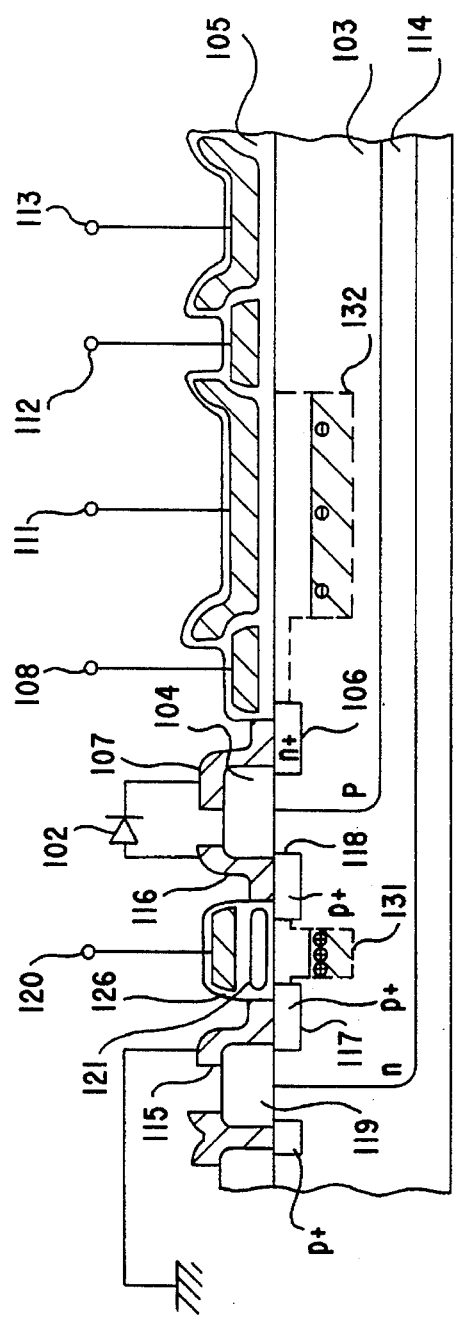
FIGS. 31, 32 and 33 are cross sectional views illustrating a solid state image sensing device according to an eleventh embodiment of the present invention.

First, under a condition in which no light is incident on the photo-diode 102, as shown in FIG. 31, a voltage supplied to the input gate 108 is controlled so as to correspond to the bias voltage of the photo-diode 102. The gate electrode 120 is maintained at a predetermined voltage of about −10 volts so that a potential well 131 is formed under the gate electrode 120. In addition, the storage electrode 111 is controlled so as to be maintained at a voltage of about 10 volts so that a potential well 132 is formed under the storage electrode 112. The transfer gate electrode 112 is maintained at 0 volts so that the transfer gate is shut down. In this state, holes corresponding to the dark current of the photo-diode 102 are injected into the potential well 131 for a predetermined time.

Figure 32:
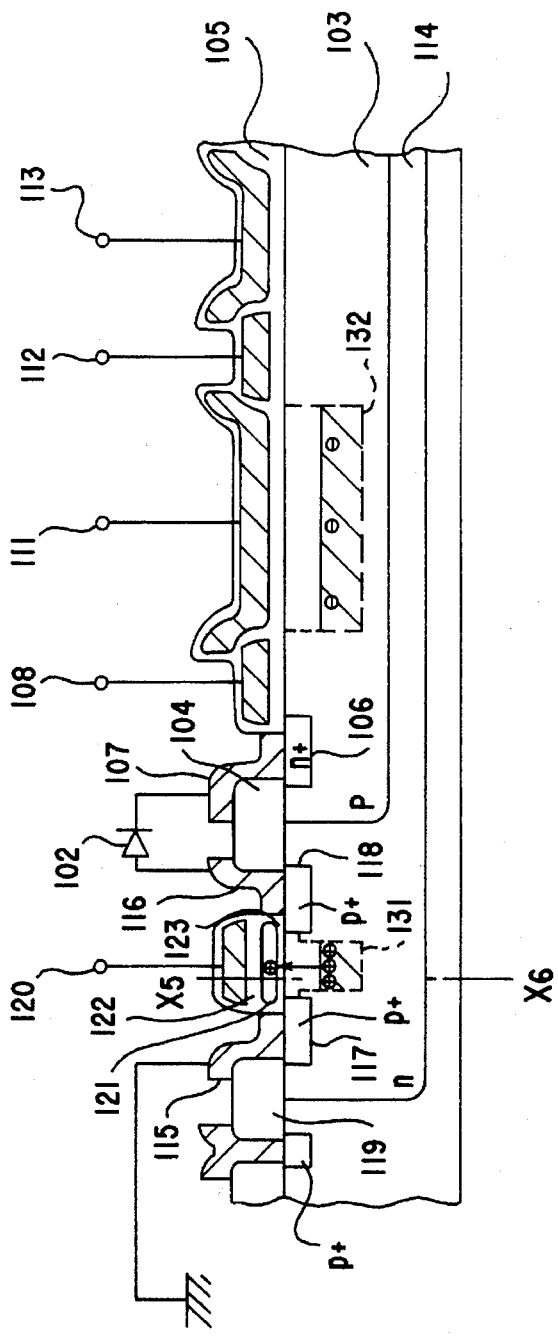

After this, as shown in FIG. 32, a high voltage of about −50 volts is supplied to the gate electrode 120, so that the holes stored in the potential well 131 are injected into the floating electrode 121.

Figure 34:
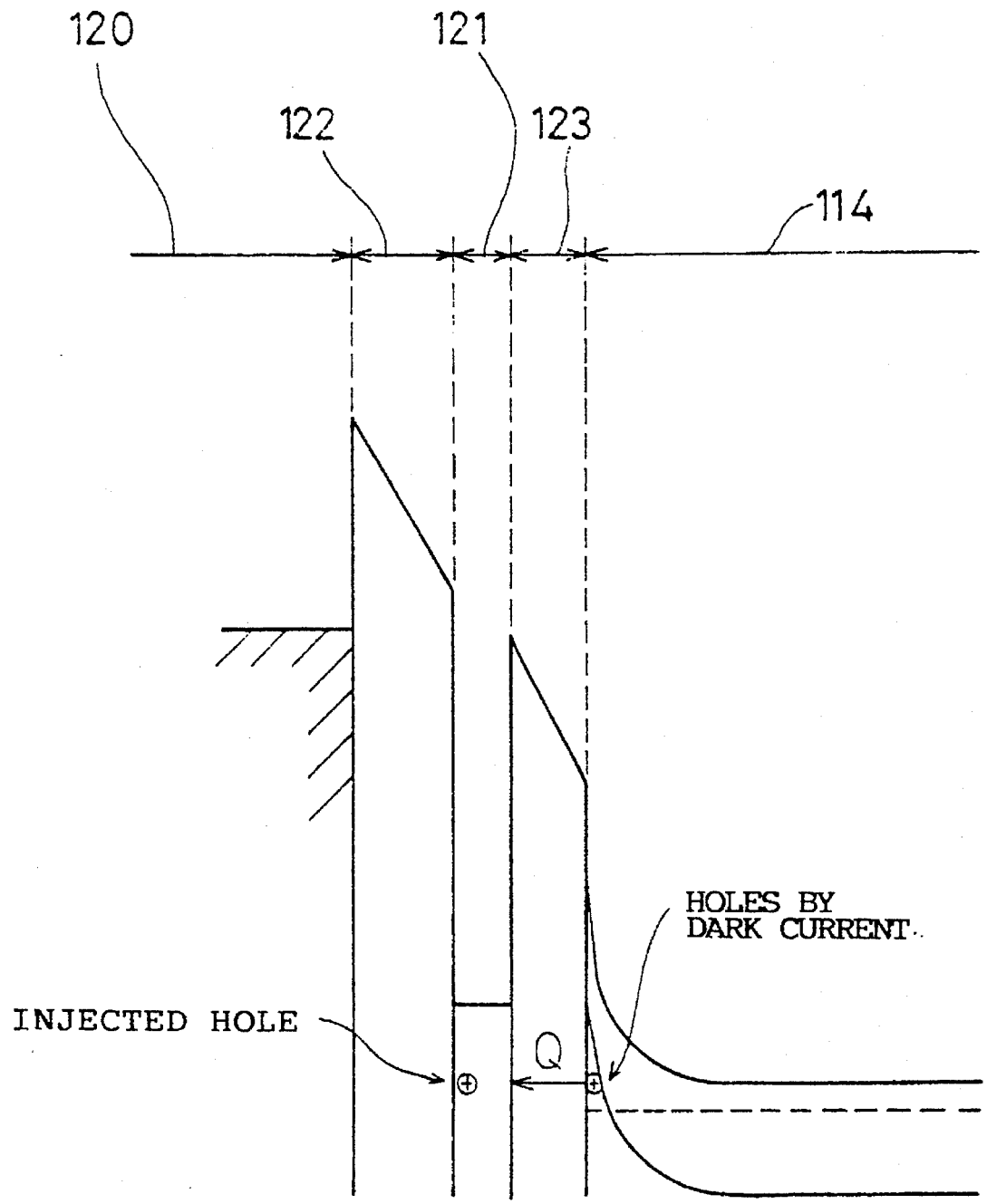
FIG. 34 is a potential diagram illustrating the potential in a section taken along a line X5–X6 shown in FIG. 32.

FIG. 34 shows the potential in a section taken along a line X5–X6 shown in FIG. 32. As shown in FIG. 34, the holes stored in the potential well 131 formed in the substrate 114 tunnel through an insulating portion 123 and are injected into the floating electrode 121. The holes are stored in the floating electrode 121. The amount of electric charge Q of the holes injected into the floating electrode 121 is in proportion to the number of holes, corresponding to the dark current of the photo-diode 102, stored in the potential well 131.

The electric charge may be injected into the floating electrode 121 as follows. That is, in a state where the electric charge corresponding to the dark current is stored in the potential well 131, light having an energy exceeding the potential barrier of the insulating portion 123 is projected onto the surface of the solid state image sensing device.

After the electric charge corresponding to the dark current of the photo-diode 102 is injected into the floating electrode 121 as described above, light is projected onto the photo-diode 102, and the imaging operation is carried out. In the imaging operation, as shown in FIG. 33, the storage electrode 111 is controlled so as to be maintained at a voltage of about 10 volts so that a potential well 133 is formed under the storage electrode 111. The signal electric charge is stored in the potential well 133. The input gate electrode 108 is maintained at a predetermined voltage and the gate electrode 120 is maintained at a predetermined voltage of about −1 volt.

In the imaging operation, a threshold voltage of a virtual transistor having a virtual drain and a virtual source which are respectively formed of the p-type regions 117 and 118 is shifted in accordance with the amount of electric charge injected into the floating electrode 121. The shifting of the threshold voltage of the virtual transistor is the same as the shifting of the threshold voltage $V_{th}$ in the first embodiment.

Due to the shifting of the threshold voltage of the virtual transistor, the operating point of the photo-diode 102 is moved in the same manner as that of the photo-diode 32 in the first embodiment so that the bias voltage of the photo-diode 102 is changed. Thus, the signal electric charge obtained based on the correction of the dispersion of the dark currents of the photo-diodes in the solid state image sensing device is stored in the potential well 133.

According to the eleventh embodiment, due to the floating electrode into which the electric charge corresponding to the dark current of the photo-diode 102 is injected, the dispersion of the dark currents of the photo-diodes in the solid state image sensing device can be reduced in the imaging operation in the same manner as in the first embodiment.

Figure 35:
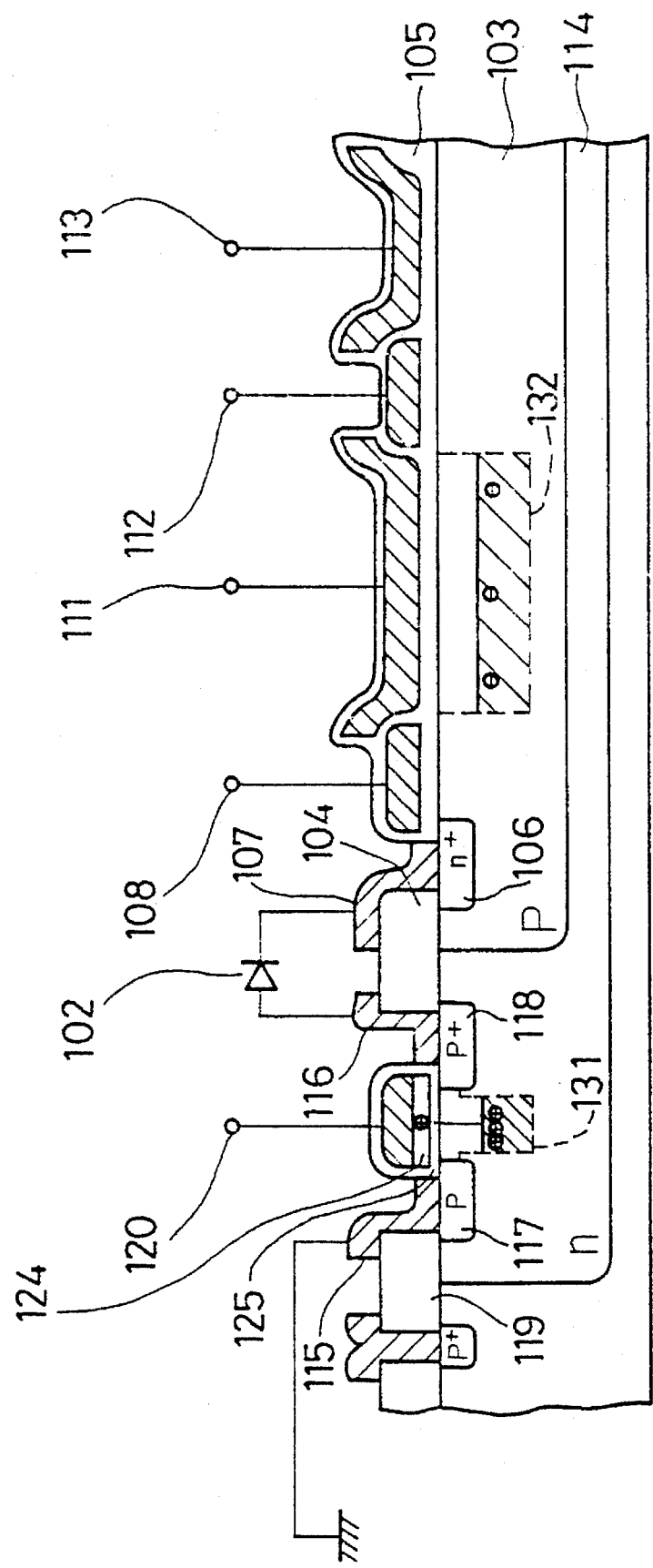
FIG. 35 is a cross sectional view illustrating a solid state image sensing device according to a twelfth embodiment of the present invention.

A description will now be given, with reference to FIG. 35, of a twelfth embodiment of the present invention. In FIG. 35, those parts which are the same as those shown in FIG. 31 are given the same reference numbers. Referring to FIG. 35, a multilayer insulating film having an insulating layer 124 made of $Si_3N_4$ and an insulating layer 125 made of $SiO_3$ is formed under the gate electrode 120.

In the twelfth embodiment, after the electric charge corresponding to the dark current of the photo-diode 102 is stored in the potential well 131, the electric charge is injected into and stored in the charge trapping region in the boundary between the insulating layers 124 and 125 and the insulating layer 124 itself. The amount of electric charge of the holes injected into the charge trapping region is in proportion to the number of holes, corresponding to the dark current of the photo-diode 102, stored in the potential well 131.

In the imaging operation, the bias voltage of the photo-diode 102 is controlled, in the same manner as the eleventh embodiment, in accordance with the amount of electric charge injected into the charge trapping region in the boundary between the insulating layers 124 and 125 and the insulating layer 124 itself. Thus, in the twelfth embodiment, due to the insulating layers 124 and 125 in which the electric charge corresponding to the dark current of each photo-diode is stored, the dispersion of the dark currents of the photo-diodes in the solid state image sensing device can be reduced in the same manner as the eleventh embodiment.

A description will now be given, with reference to FIG. 36, of a thirteenth embodiment of the present invention. In the thirteenth embodiment, the input circuit having the function for correcting the dark current of the photo-diode as described above is used as an input circuit in the solid state image sensing device having a TDI (Time Delay And Integration) function. In the solid state image sensing device having the TDI function, the signal electric charges obtained from a plurality of photo-diodes for one pixel are delayed and added to each other in order to improve the signal-to-noise ratio.

Figure 36:
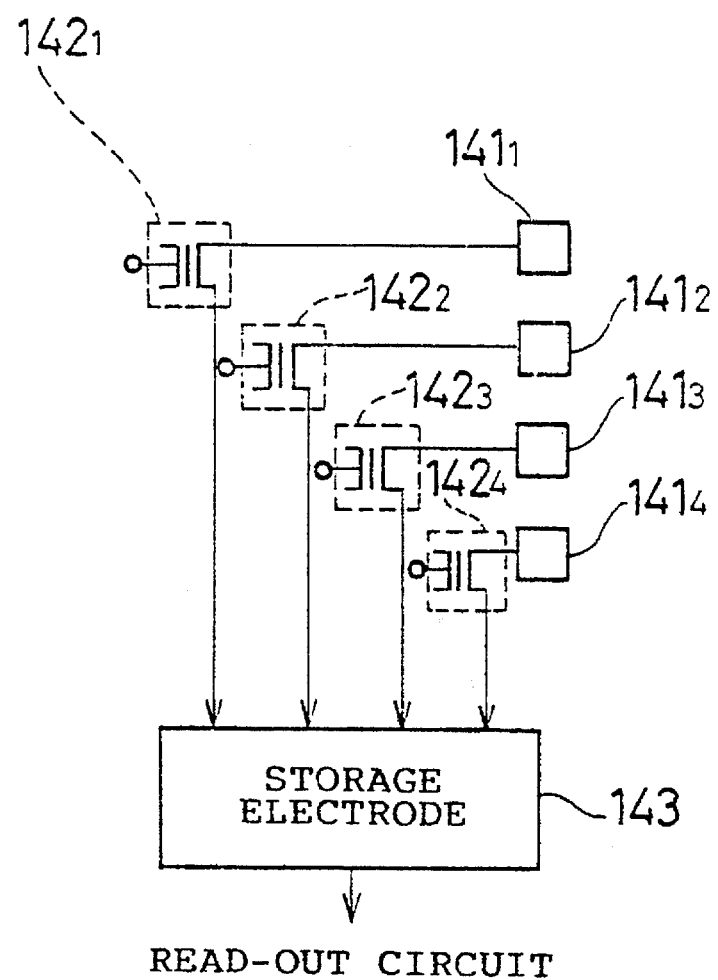
FIG. 36 is a diagram illustrating an essential structure of a solid state image sensing device according to a thirteenth embodiment of the present invention.

Referring to FIG. 36, four photo-diodes $141_1$–$141_4$ are provided for each pixel. Input circuits $142_1$–$142_4$ are respectively coupled to the photo-diodes $141_1$–$141_4$. Each of the input circuits $142_1$–$142_4$ has the function of correcting the dark current of a corresponding one of the photo-diodes $141_1$–$141_4$. The signal electric charges generated by the photo-diodes $141_1$–$141_4$ are controlled by the input circuits $142_1$–$142_4$ and the controlled signal electric charges are delayed and integrated with each other by a storage electrode 143. A signal obtained by the integrating operation of the storage electrode 143 is supplied to a read-out circuit.

In a general solid state image device having the TDI function, if a photo-diode having a large dark current is included in the photo-diodes $141_1$–$141_4$, a potential well located under the storage electrode 143 overflows while the integrating operation is being carried out. On the other hand, in the example of the solid state image device shown in FIG. 36, the signal electric charge output from each of the input circuits $142_1$–$142_4$ is controlled in accordance with the dark current of a corresponding one of the photo-diodes $141_1$–$141_4$ so that the component corresponding to the dark current is uniform in the signal electric charge. Thus, even if a photo-diode having a large dark current is included in the photo-diodes $141_1$–$141_4$, there is no danger that the potential well located under the storage electrode 143 will overflow. As a result, in the solid state image sensing device having the TDI function, the number of photo-diodes for each pixel can be increased.

The present invention is not limited to the aforementioned embodiments, and variations and modifications may be made without departing from the scope of the claimed invention.

What is claimed is:

1. A solid state image sensing device having a plurality of pixels each of which outputs to a transmission portion signal electric charge corresponding to an amount of light projected thereon, the signal electric charge transmitted by said transmission portion being output as an image signal for each pixel from said solid state image sensing device, each pixel comprising:

a photo-diode;

storage means, operably coupled to said photo-diode, for storing electric charge corresponding to a current output from said photo-diode onto which a light is projected;

transfer means, operably coupled to said storage means, for transferring the electric charge stored by said storage means to said transmission portion; and control means, operably coupled to said transfer means, for controlling, in accordance with a characteristic of said photo-diode, an amount of signal electric charge to be received by said transmission portion, wherein said control means has storage control means for controlling, in accordance with the characteristic of said photo-diode, an amount of electric charge stored by said storage means so that the amount of signal electric charge to be received by said transmission portion is controlled in accordance with the characteristic of said photo-diode, wherein said storage control means has bias control means, and wherein said bias control means controls a bias voltage supplied to said photo-diode in accordance with the characteristic of said photo-diode so that the amount of electric charge stored by said storage means is controlled, and wherein said bias control means has an electrode formed on a structure having an insulating film and a substrate so as to be separated from said substrate by said insulating film, and a control structure formed in said insulating film under said electrode, control electric charge corresponding to the characteristic of said photo-diode being injected into said control structure by controlling a voltage supplied to said electrode so that the bias voltage of said photo-diode is controlled by the control electric charge injected into said control structure.

2. The solid state image sensing device as claimed in claim 1, wherein the amount of signal electric charge to be received by said transmission portion is controlled by said control means based on a dark current characteristic of said photo-diode.

3. The solid state imaging sensing device as claimed in claim 1, wherein the amount of signal electric charge to be received by said transmission portion is controlled by said control means based on a sensitivity characteristic of said photo-diode.

4. The solid state image sensing device as claimed in claim 1, wherein said electrode and said control structure are located at a cathode side of said photo-diode so that the control electric charge corresponding to electrons supplied from said photo-diode in accordance with the characteristic of said photo-diode is injected into said control structure.

5. The solid state image sensing device as claimed in claim 1, wherein said electrode and said control structure are located at an anode side of said photo-diode so that the control electric charge corresponding to holes supplied from said photo-diode in accordance with the characteristic of said photo-diode is injected into said control structure.

6. The solid state image sensing device as claimed in claim 1, wherein said control structure is a floating electrode.

7. The solid state image sensing device as claimed in claim 1, wherein said control structure is a multilayer insulating film having a plurality of insulating layers which are made of different materials.

8. The solid state image sensing device as claimed in claim 1, wherein said electrode has a first part and a second part, wherein said first part is closer to said photo-diode than said second part, and wherein said control structure is formed under said second part.

9. A solid state image sensing device having a plurality of pixels each of which outputs to a transmission portion signal electric charge corresponding to an amount of light projected thereon, the signal electric charge transmitted by said transmission portion being output as an image signal for each pixel from said solid state image sensing device, each pixel comprising:

a photo-diode;

storage means, operably coupled to said photo-diode, for storing electric charge corresponding to a current output from said photo-diode onto which a light is projected;

transfer means, operably coupled to said storage means, for transferring the electric charge stored by said storage means to said transmission portion; and control means, operably coupled to said transfer means, for controlling, in accordance with a characteristic of said photo-diode, an amount of signal electric charge to be received by said transmission portion, wherein said control means has storage control means for controlling, in accordance with the characteristic of said photo-diode, an amount of electric charge stored by said storage means so that the amount of signal electric charge to be received by said transmission portion is controlled in accordance with the characteristic of said photo-diode, wherein said control means has transfer control means, and wherein said transfer control means controls, in accordance with the characteristic of said photo-diode, an amount of signal electric charge transferred from said storage means to said transmission portion by said transfer means so that the amount of signal electric charge to be received by said transmission portion is controlled in accordance with the characteristic of said photo-diode, and wherein said transfer control means has an electrode formed on a structure having a substrate and an insulating film, said insulating film separating said electrode from said substrate, and a control structure formed in said insulating film under said electrode, wherein said control structure is supplied with control electric charge corresponding to the characteristic of said photo-diode by controlling a voltage supplied to said electrode so that the amount of signal electric charge transferred from said storage means to said transmission portion is controlled by the control electric charge supplied to said control structure.

10. The solid state image sensing device as claimed in claim 9, wherein said control structure is a floating electrode.

11. The solid state image sensing device as claimed in claim 9, wherein said control structure is a multilayer insulating film having a plurality of insulating layers which are made of different materials.

12. The solid state image sensing device as claimed in claim 9, wherein said transfer means has a transfer gate electrode and a transfer gate which is either opened or shut in accordance with a voltage supplied to transfer gate electrode, the control electric charge being transferred to said transmission portion through said transfer gate which is opened, and wherein said transfer gate electrode is used as said electrode used to inject the control electric charge into said control structure.

13. The solid state image sensing device as claimed in claim 9, wherein said transfer means has a transfer gate which is either opened or shut down in accordance with a voltage supplied to said transfer gate, wherein said transmission portion is supplied with the control electric charge through said transfer gate which is opened, and wherein said control structure and said electrode for supplying the electric charge to said control structure are located between said storage means and said transfer gate.

14. The solid state image sensing device as claimed in claim 13, wherein said electrode which supplies the control electric charge to said control structure is a skimming gate electrode.

15. The solid state image sensing device as claimed in claim 9, wherein said storage means has a plurality of storage portions, and wherein said control structure and said electrode which supply the control electric charge to said control structure are located between at least two storage portions which are adjacent to each other.

16. The solid state image sensing device as claimed in claim 9, wherein said storage means has a first storage portion and second storage portion, and wherein said control structure and said electrode which supply the electrode to said control structure are located between said first and second storage portions.

17. The solid state image sensing device as claimed in claim 16, wherein said electrode which supplies the control electric charge to said control structure is a skimming electrode.

18. A solid state image sensing device having a plurality of pixels each of which outputs to a transmission portion signal electric charge corresponding to an amount of light projected thereon, the signal electric charge transmitted by said transmission portion being output as an image signal for each pixel from said solid state image sensing device, each pixel comprising:

a plurality of photo-diodes;

storage means, operably coupled to said plurality of photo-diodes, for integrating electric charges corresponding to currents output from said plurality of photo-diodes onto which lights are projected and for storing integrated electric charge;

transfer means, operably coupled to said storage means, for transferring the integrated electric charge stored by said storage means to said transmission portion; and control means, operably coupled to said transfer means, for controlling, in accordance with characteristics of said plurality of photo-diodes, an amount of integrated signal electric charge to be received by said transmission portion, wherein the amount of electric charge supplied to said storage means is controlled by said control means based on a dark current characteristic of said photo-diode.

* * * * *